(12) United States Patent
Banerjee et al.

(10) Patent No.: US 12,712,529 B2
(45) Date of Patent: Aug. 18, 2026

(54) COMMUNICATION CIRCUIT WITH ANALOG DUTY-CYCLE DETECTION

(71) Applicant: TEXAS INSTRUMENTS INCORPORATED, Dallas, TX (US)

(72) Inventors: Deep Banerjee, Bengaluru (IN); Lokesh Kumar Gupta, Bengaluru (IN); Madhulatha Bonu, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/240,796

(22) Filed: Aug. 31, 2023

(65) Prior Publication Data

US 2024/0322799 A1 Sep. 26, 2024

(30) Foreign Application Priority Data

Mar. 24, 2023 (IN) ............................. 202341021787

(51) Int. Cl.
*H03K 3/017* (2006.01)
*H03K 3/037* (2006.01)
*H03K 17/56* (2006.01)

(52) U.S. Cl.
CPC ............. *H03K 3/017* (2013.01); *H03K 3/037* (2013.01); *H03K 17/56* (2013.01)

(58) Field of Classification Search
CPC ........ H03K 3/017; H03K 3/037; H03K 17/56; H03K 9/08; H03K 5/04; H03K 5/06; H03K 5/05; H03K 5/065; H03K 7/08
See application file for complete search history.

(56) References Cited

U.S. PATENT DOCUMENTS 11,368,142 B1 * 6/2022 Kuzmenka ................ G06F 1/04

* cited by examiner

*Primary Examiner* — Jung Kim
(74) *Attorney, Agent, or Firm* — Xianghui Huang; Frank D. Cimino

(57) ABSTRACT

An analog duty-cycle detector includes: off-time detection circuitry; on-time detection circuitry; compare circuitry; and a controller. The off-time detection circuitry includes a first transistor and a first capacitor. The on-time detection circuitry includes a second transistor and a second capacitor. The compare circuitry has a first terminal, a second terminal, and a third terminal. The first terminal of the compare circuitry is coupled to a first terminal of the first capacitor. The second terminal of the compare circuitry is coupled to a first terminal of the second capacitor. The controller has a first terminal and a second terminal. The first terminal of the controller coupled to a control terminal of the first transistor. The second terminal of the controller coupled to the control terminal of the second transistor.

8 Claims, 14 Drawing Sheets

COMMUNICATION CIRCUIT WITH ANALOG DUTY-CYCLE DETECTION

CROSS REFERENCE TO RELATED APPLICATION

The present application is related to: India Provisional Application No. 202341021787, titled "Analog High Speed Duty Cycle Detection for CAN-XL Protocol", filed on Mar. 24, 2023, which is hereby incorporated by reference in its entirety.

BACKGROUND

In electronics, pulse-width modulation (PWM) or duty-cycle modulation may be used for control operations or communications. The duty-cycle refers to the amount of time, during a period, that a signal is high. Duty-cycle is often expressed as a percentage, where 0% means the signal stays low for the entire period, 50% means the signal stays high for half of the period, and 100% means the signal stays high for all of the period. Some communication protocols use duty-cycle to communicate bits of data. For example, a duty-cycle greater than 50% may be interpreted as a logical 1, and a duty-cycle less than 50% may be interpreted as a logical 0. One way to detect duty-cycle is to use a counter and a high-speed clock relative to the duty-cycle period. As an example, if the total period corresponds to 2000 counts, a count of 200 indicates a 10% duty-cycle, a count of 1000 indicates a 50% duty-cycle, and so on. Using a counter and a high-speed precision clock for duty-cycle detection is expensive.

SUMMARY

In an example, a circuit includes an analog duty-cycle detector. The analog duty-cycle detector includes: off-time detection circuitry; on-time detection circuitry; compare circuitry; and a controller. The off-time detection circuitry has a first terminal, a second terminal, a third terminal, and a fourth terminal. The off-time detection circuitry includes a first transistor and a first capacitor. The first transistor has a first terminal, a second terminal, and a control terminal. The first capacitor has a first terminal and a second terminal. The first terminal of the first transistor is coupled to the first terminal of the off-time detection circuitry. The second terminal of the first transistor is coupled to the first terminal of the first capacitor. The on-time detection circuitry has a first terminal, a second terminal, a third terminal, and a fourth terminal. The on-time detection circuitry includes a second transistor and a second capacitor. The second transistor has a first terminal, a second terminal, and a control terminal. The second capacitor has a first terminal and a second terminal. The first terminal of the second transistor is coupled to the first terminal of the on-time detection circuitry. The second terminal of the second transistor is coupled to the first terminal of the second capacitor. The compare circuitry has a first terminal, a second terminal, and a third terminal. The first terminal of the compare circuitry is coupled to the third terminal of the off-time detection circuitry. The second terminal of the compare circuitry is coupled to the third terminal of the on-time detection circuitry. The controller has a first terminal and a second terminal. The first terminal of the controller is coupled to the second terminal of the off-time detection circuitry. The second terminal of the controller is coupled to the second terminal of the on-time detection circuitry.

In another example, a circuit includes: a first duty-cycle detector circuit; a first latch circuit; a second duty-cycle detector circuit; and a second latch circuit. The first duty-cycle detector circuit has a first terminal and a second terminal. The first latch circuit has a first terminal, a second terminal, and a third terminal. The first terminal of the first latch circuit is coupled to the second terminal of the first duty-cycle detector circuit. The second duty-cycle detector circuit has a first terminal and a second terminal. The second latch circuit has a first terminal, a second terminal, and a third terminal. The first terminal of the second latch circuit is coupled to the second terminal of the second duty-cycle detector circuit.

In yet another example, a transceiver includes: a first terminal; a second terminal; a third terminal; a fourth terminal; transmitter circuitry coupled between the first terminal, the third terminal, and the fourth terminal, the transmitter circuitry including an analog duty-cycle detector circuit with a comparator; and receiver circuitry coupled between the second terminal, the third terminal, and the fourth terminal.

DETAILED DESCRIPTION

Figure 1:
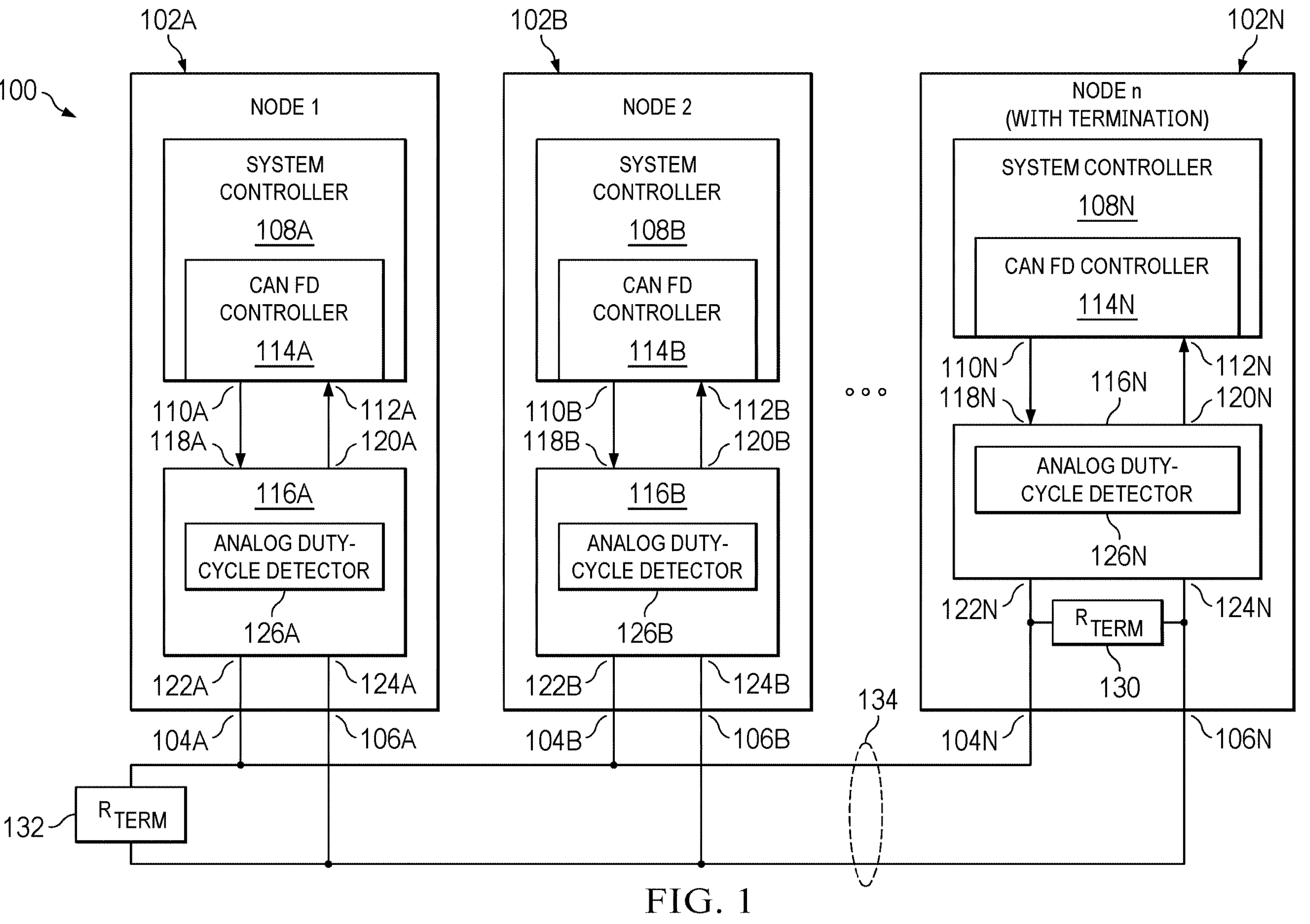
FIG. 1 is a diagram showing an example system.

The same reference numbers or other reference designators are used in the drawings to designate the same or similar features. Such features may be the same or similar either by function and/or structure.

FIG. 1 is a diagram showing an example system 100. The system 100 includes a plurality of communication nodes 102A to 102N coupled together via bus lines 134. In an example, the communication nodes 102A to 102N each implement or execute one or more Controller Area Network (CAN) communication protocols and/or is consistent with or is operated in a system that is consistent with one or more CAN communication protocols. At respective ends of the bus lines 134 are a first termination resistor 130 and a second termination resistor 132. In some examples, the first termination resistor 130 is part of the communication node 102N as shown in FIG. 1. In other examples, the first termination resistor 130 is external to the communication node 102N.

Each of the communication nodes 102A to 102N has a respective first terminal 104A to 104N and a respective second terminal 106A to 106N. As shown, each of the communication nodes 102A to 102N includes a respective system controller 108A to 108N and a respective CAN transceiver 116A to 116N. Each of the system controllers 108A to 108N has a respective first terminal 110A to 110N and a respective second terminal 112A to 112N. Also, each of the system controllers 108A to 108N includes a respective CAN flexible data-rate (CAN FD) controller 114A to 114N. In some examples, each of the CAN FD controllers 114A to 114N may be a CAN extra-long (CAN XL) controller. Each of the CAN transceivers 116A to 116N has a respective first terminal 118A to 118N, a respective second terminal 120A to 120N, a respective third terminal 122A to 122N, and a respective fourth terminal 124A to 124N.

As shown, the first terminals 104A to 104N of the communication nodes 102A to 102N are coupled to a first bus of the bus lines 134. The second terminals 106A to 106N of the communication nodes 102A to 102N are coupled to a second conductor of the bus lines 134. Each one of the first terminals 118A to 118N of the CAN transceivers 116A to 116N is coupled to a respective first terminal 110A to 110N of the system controllers 108A to 108N. Each one of the second terminals 120A to 120N of the CAN transceivers 116A to 116N is coupled to a respective second terminal 112A to 112N of the system controllers 108A to 108N. Each one of the third terminals 122A to 122N of the CAN transceivers 116A to 116N is coupled to a respective first terminals 104A to 104N of the communication nodes 102A to 102N. Each one of the fourth terminals 124A to 124N of the CAN transceivers 116A to 116N is coupled to a respective second terminal 106A to 106N of the communication nodes 102A to 102N.

As shown, the CAN transceivers 116A to 116N include respective analog duty-cycle detector circuits 126A to 126N. Each of the analog duty-cycle detector circuits 126A to 126N operates to: receive a data signal (e.g., TXD herein); detect whether the duty-cycle for each period of the data signal is greater than a threshold (e.g., 50%) or less than the threshold; and provide the duty-cycle detection results. In different examples, the duty-cycle detection results may be used to decode the data signal, change the operating mode of a CAN transceiver, and/or perform other operations based on the duty-cycle detection results.

Figure 2:
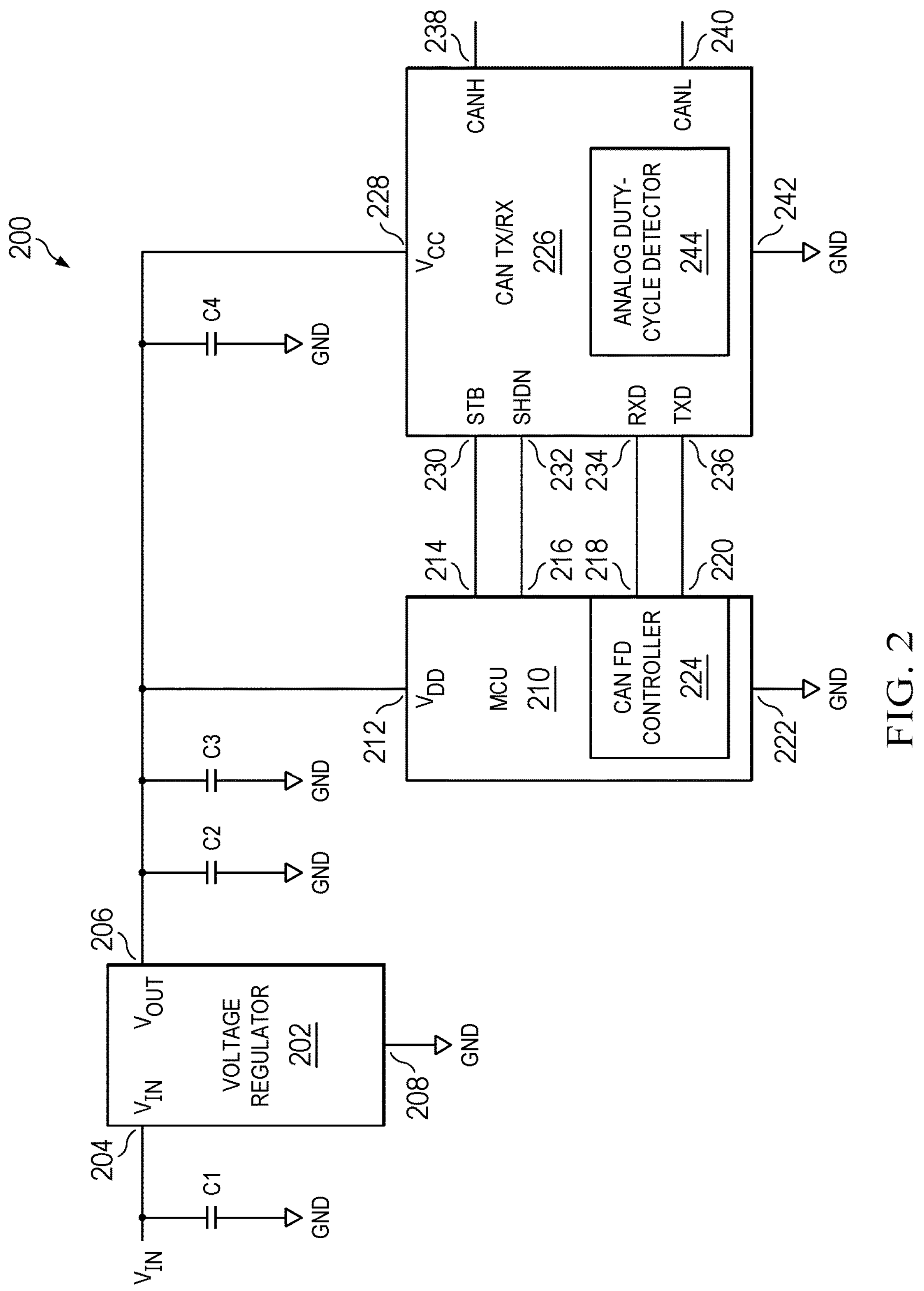
FIG. 2 is a diagram showing an example communication node.

FIG. 2 is a diagram showing an example communication node 200. The communication node 200 is an example of any one of the communication nodes 102A to 102N in FIG. 1. In the example of FIG. 2, the communication node 200 includes capacitors C1, C2, C3, and C4, a voltage regulator 202, a microcontroller (MCU) 210, and a CAN transceiver 226 in the arrangement shown. The MCU 210 is an example of any one of the system controllers 108A to 108N in FIG. 1. As shown, the MCU 210 includes a CAN FD controller 224. The CAN FD controller 224 is an example of any one of the CAN FD controllers 114A to 114N in FIG. 1. The CAN transceiver 226 is an example of any one of the CAN transceivers 116A to 116N in FIG. 1. As shown, the CAN transceiver 226 includes an analog duty-cycle detector circuit 244. The analog duty-cycle detector circuit 244 is an example of any one of the analog duty-cycle detector circuits 126A to 126N in FIG. 1

In the example of FIG. 2, each of the capacitors C1, C2, C3, and C4 has a first terminal and a second terminal. The voltage regulator 202 has a first terminal 204, a second terminal 206, and a third terminal 208. The MCU 210 has a first terminal 212, a second terminal 214, a third terminal 216, a fourth terminal 218, a fifth terminal 220, and a sixth terminal 222. The CAN transceiver 226 has a first terminal 228, a second terminal 230, a third terminal 232, a fourth terminal 234, a fifth terminal 236, a sixth terminal 238, a seventh terminal 240, and an eighth terminal 242.

In the example of FIG. 2, the first terminal 204 of the voltage regulator 202 is coupled to the first terminal of the capacitor C1 and receives an input voltage ($V_{IN}$). The second terminal of the capacitor C1 is coupled to a ground terminal or ground. The second terminal 206 of the voltage regulator 202 is coupled to: the first terminal of the capacitor C2; the first terminal of the capacitor C3; the first terminal of the capacitor C4; the first terminal of the MCU 210; and the first terminal of the CAN transceiver 226. In some examples, the second terminal 206 of the voltage regulator provides an output voltage ($V_{OUT}$). The first terminal 212 of the MCU 210 receives a first voltage supply ($V_{DD}$) responsive to $V_{OUT}$ and the values of the capacitors C2 and C3. The first terminal 228 of the CAN transceiver 226 receives a second voltage supply ($V_{CC}$) responsive to $V_{OUT}$ and the values of the capacitors C2, C3, and C4. As shown, the third terminal 208 of the voltage regulator 202, and the second terminals of the capacitors C2, C3, and C4 are coupled to ground terminals or ground.

In the example of FIG. 2, the second terminal 214 of the MCU 210 is coupled to the second terminal 230 of the CAN transceiver 226. The third terminal 216 of the MCU 210 is coupled to the third terminal 232 of the CAN transceiver 226. The fourth terminal 218 of the MCU 210 is coupled to the fourth terminal 234 of the CAN transceiver 226. The fifth terminal 220 of the MCU 210 is coupled to the fifth terminal 236 of the CAN transceiver 226. The sixth terminal 222 of the MCU 210 is coupled to a ground terminal or ground. The sixth terminal 238 of the CAN transceiver 226 is coupled to a first bus line (labeled "CANH"), where CANH is an example of a first bus line of the bus lines 134 in FIG. 1. The seventh terminal 240 of the CAN transceiver 226 is coupled to a second bus line (labeled "CANL"), where CANL is an example of a second bus line of the bus lines 134 in FIG. 1.

In some examples, the MCU 210 operates to: receive $V_{DD}$ at its first terminal 212; provide a standby signal (STB) at its second terminal 214 responsive to $V_{DD}$ and a trigger (e.g., a timing trigger or other trigger) to put the CAN transceiver 226 in a low power mode; provide a shutdown signal (SHDN) at its third terminal 216 responsive to $V_{DD}$ and a trigger (e.g., a timing trigger or other trigger) to put the CAN transceiver 226 in an optional ultra-low power mode; receive data from the CAN transceiver 226 at its fourth terminal 218 responsive to $V_{DD}$ and data received from the CAN bus lines; provide outgoing data at its fifth terminal 220 responsive to $V_{DD}$ and a data transmission to CAN bus lines; and process the received incoming data to send control information to an electronic control system (e.g., for a vehicle). In some examples, the MCU 210 provides control information to an engine control module responsive to sensor data and/or other communications obtained using CAN bus lines. In some examples, the CAN FD controller 224 prepares outgoing data based on sensor data in a vehicle. Example sensor data may include engine temperature, rotations-per-minute (RPMs), or other sensor data. In some examples, the CAN FD controller 224 handles incoming data responsive to a wake-up pattern received on the CAN bus lines to wake up the system from a low power mode (e.g., the standby-mode).

In some examples, the CAN transceiver 226 operates to: receive $V_{CC}$ at its first terminal 228; if the STB signal is received at its second terminal 230, enter a low-power mode but ready to respond to a wake-up pattern received on the CAN bus lines; if the SHDN signal is received at its third terminal 232, enter an ultra-low power mode; in a normal mode, provide data at its fourth terminal 234 for the MCU 210 responsive to $V_{CC}$ and data received on the CAN bus lines; in a low-power mode, provide a wake-up signal at its fourth terminal 234 responsive to CAN bus lines data having a wake-up pattern; receive data from the MCU 210 at its fifth terminal 236 responsive to $V_{CC}$, select an operating mode (e.g., a fast data mode and a slow data mode), decode the receive data, and send the decoded data on the CAN bus lines; receive or transmit data via its sixth terminal 238 and its seventh terminal 240 based on differential signaling. When transmitting data to the CAN bus lines using the sixth terminal 238 and the seventh terminal 240, the CAN transceiver 226 may prepare the data to be transmitted based on information received at the fifth terminal 236 (the TXD terminal) and the second terminal 230 (the STB terminal). In different scenarios, the CAN transceiver 226 may use a fast data mode, a slow data mode, or a no drive mode in case of a receive mode or low-power mode. When receiving data from the CAN bus lines, the CAN transceiver 226 receives a differential voltage at its sixth terminal 238 (the CANH terminal) and its seventh terminal 240 (the CANL terminal). In a standby mode, the CAN transceiver 226 only responds to valid wake-up patterns received on CAN bus lines. In a fast data mode (e.g., selected responsive to signaling at the fifth terminal 236), the CAN transceiver 226 may receive CAN-XL data from the CAN bus lines. In a slow data mode, the CAN transceiver 226 may receive CAN-FD data from the CAN bus lines.

The analog duty-cycle detector circuit 244 operates to: receive a data signal; analyze the data signal to determine duty-cycle detection results; and provide the duty-cycle detection results or a related data signal as an output. The CAN transceiver 226 operates to obtain the duty-cycle detection results; and determine data (e.g., logical 1 or logical 0 values) to be transmitted on the CAN bus lines responsive to the duty-cycle detection. As an example, if duty-cycle detection results are less than 50%, a logical 0 is included with the determined data. If the duty-cycle detection results are greater than 50%, a logical 1 is included with the determined data. In some examples, the duty-cycle detection results may determine many data bits to be transmitted on the CAN bus lines in accordance with a CAN-XL protocol. As another option, the CAN transceiver 226 may operate to: obtain the duty-cycle detection results; and change its operating mode responsive to duty-cycle detection results.

Figure 3:
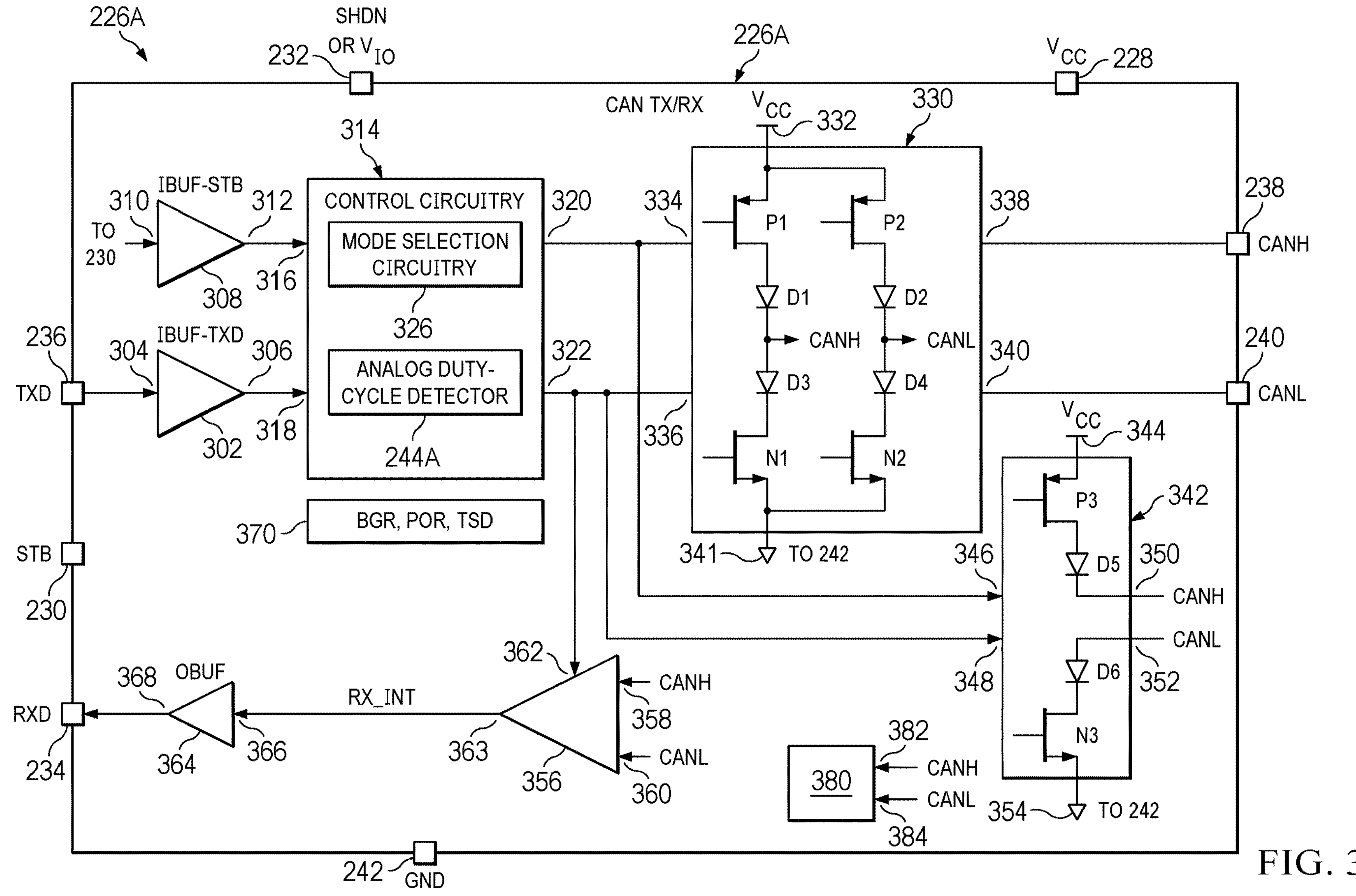
FIG. 3 is a diagram showing an example controller area network (CAN) transceiver.

FIG. 3 is a diagram showing an example CAN transceiver 226A. The CAN transceiver 226A is an example of the CAN transceiver 226 in FIG. 2. As shown, the CAN transceiver 226A includes the first terminal 228, the second terminal 230, the third terminal 232, the fourth terminal 234, the fifth terminal 236, the sixth terminal 238, the seventh terminal 240, and the eighth terminal 242 described in FIG. 2. In the example of FIG. 3, the CAN transceiver 226A includes a first buffer circuit 302, a second buffer circuit 308, control circuitry 314, a first driver circuit 330, a second driver circuit 342, receiver circuitry 356, a third buffer circuit 364, power management circuitry 370, and bias voltage circuitry 380 in the arrangement shown.

The first buffer circuit 302 has a first terminal 304 and a second terminal 306. The second buffer circuit 308 has a first terminal 310 and a second terminal 312. The control circuitry 314 has a first terminal 316, a second terminal 318, a third terminal 320, and a fourth terminal 322. The first driver circuit 330 has a first terminal 332, a second terminal 334, a third terminal 336, a fourth terminal 338, a fifth terminal 340, and a sixth terminal 341. The second driver circuit 342 has a first terminal 344, a second terminal 346, a third terminal 348, a fourth terminal 350, a fifth terminal 352, and a sixth terminal 354. The receiver circuitry 356 has a first terminal 358, a second terminal 360, third terminal 362, and a fourth terminal 363. The third buffer circuit 364 has a first terminal 366, and a second terminal 368. The power management circuitry 370 includes one or more terminals (not shown). The bias voltage circuitry 380 has a first terminal 382 and a second terminal 384.

In the example of FIG. 3, the first terminal 228 of the CAN transceiver 226A receives $V_{CC}$. The second terminal 230 of the CAN transceiver 226A receives the standby (STB) signal. The third terminal 232 of the CAN transceiver 226A receives the shutdown (SHDN) signal or a second supply voltage ($V_{IO}$). The fourth terminal 234 of the CAN transceiver 226A provides a receive data (RXD) signal. The fifth terminal 236 of the CAN transceiver 226A receives a transmit data (TXD) signal. The sixth terminal 238 of the CAN transceiver 226A is a CANH terminal. The seventh terminal 240 of the CAN transceiver 226A is a CANL terminal. The eighth terminal 242 is a ground terminal.

In the example of FIG. 3, the first terminal 304 of the first buffer circuit 302 is coupled to the fifth terminal 236 of the CAN transceiver 226A. The second terminal 306 of the first buffer circuit 302 is coupled to the second terminal 318 of the control circuitry 314. The first terminal 310 of the second buffer circuit 308 is coupled to the second terminal 230 of the CAN transceiver 226A. The second terminal 312 of the second buffer circuit 308 is coupled to the first terminal 316 of the control circuitry 314. The third terminal 320 of the control circuitry 314 is coupled to the second terminal 334 of the first driver circuit 330 and to the second terminal 346 of the second driver circuit 342. The fourth terminal 322 of the control circuitry 314 is coupled to the third terminal 336 of the first driver circuit 330, to the third terminal 348 of the second driver circuit 342, and to the third terminal 362 of the receiver circuitry 356.

The first terminal 332 of the first driver circuit 330 is coupled to the first terminal 228 of the CAN transceiver 226A and receives $V_{CC}$. The fourth terminal 338 of the first driver circuit 330 is coupled to the sixth terminal 238 of the CAN transceiver 226A. The fifth terminal 340 of the first driver circuit 330 is coupled to the seventh terminal 240 of the CAN transceiver 226A. The sixth terminal 341 of the first driver circuit 330 is coupled to the eighth terminal 242 of the CAN transceiver 226A. The first terminal 344 of the second driver circuit 342 is coupled to the first terminal 228 of the CAN transceiver 226A and receives $V_{CC}$. The fourth terminal 350 of the second driver circuit 342 is coupled to the sixth terminal 238 of the CAN transceiver 226A. The fifth terminal 352 of the second driver circuit 342 is coupled to the seventh terminal 240 of the CAN transceiver 226A. The sixth terminal 354 of the second driver circuit 342 is coupled to the eighth terminal 242 of the CAN transceiver 226A.

The first terminal 358 of the receiver circuitry 356 is coupled to the sixth terminal 238 of the CAN transceiver 226A. The second terminal 360 of the receiver circuitry 356 is coupled to the seventh terminal 240 of the CAN transceiver 226A. The fourth terminal 363 of the receiver circuitry 356 is coupled to the first terminal 366 of the third buffer circuit 364. The second terminal 368 of the third buffer circuit 364 is coupled to the fourth terminal 234 of the CAN transceiver 226A. The first terminal 382 of the bias voltage circuitry 380 is coupled to the sixth terminal 238 of the CAN transceiver 226A. The second terminal 384 of the bias voltage circuitry 380 is coupled to the seventh terminal 240 of the CAN transceiver 226A.

In the example of FIG. 3, the first driver circuit 330 includes transistors P1, P2, N1, N2, and diodes D1 to D4 in the arrangement shown. Each of the transistors P1, P2, N1, and N2 has a first terminal, a second terminal, and a control terminal. Each of the diodes D1 to D4 has an anode terminal and a cathode terminal. As shown, the first terminals of the transistors P1 and P2 are coupled to the first terminal 332 of the first driver circuit 330. The second terminal of the transistor P1 is coupled to the anode terminal of the diode D1. The cathode terminal of the diode D1 is coupled to the anode terminal of the diode D3. The cathode terminal of the diode D1 and the anode terminal of the diode D3 are coupled to the fourth terminal 338 of the first driver circuit 330. The cathode terminal of D3 is coupled to the first terminal of the transistor N1. The second terminal of the transistor N1 is coupled to the sixth terminal 341 of the first driver circuit 330. The second terminal of the transistor P2 is coupled to the anode terminal of the diode D2. The cathode terminal of diode D2 is coupled to the anode terminal of the diode D4. The cathode terminal of the diode D2 and the anode terminal of the diode D4 are coupled to the fifth terminal 340 of the first driver circuit 330. The cathode terminal of D4 is coupled to the first terminal of the transistor N2. The second terminal of the transistor N2 is coupled to the sixth terminal 341 of the first driver circuit 330.

In the example of FIG. 3, the first driver circuit 330 includes transistors P1, P2, N1, N2, and diodes D1 to D4 in the arrangement shown. Each of the transistors P1, P2, N1, and N2 has a first terminal, a second terminal, and a control terminal. Each of the diodes D1 to D4 has an anode terminal and a cathode terminal. As shown, the first terminals of the transistors P1 and P2 are coupled to the first terminal 332 of the first driver circuit 330. The second terminal of the transistor P1 is coupled to the anode terminal of the diode D1. The cathode terminal of the diode D1 is coupled to the anode terminal of the diode D3. The cathode terminal of the diode D1 and the anode terminal of the diode D3 are coupled to the fourth terminal 338 of the first driver circuit 330. The cathode terminal of D3 is coupled to the first terminal of the transistor N1. The second terminal of the transistor N1 is coupled to the sixth terminal 341 of the first driver circuit 330. The second terminal of the transistor P2 is coupled to the anode terminal of the diode D2. The cathode terminal of diode D2 is coupled to the anode terminal of the diode D4. The cathode terminal of the diode D2 and the anode terminal of the diode D4 are coupled to the fifth terminal 340 of the first driver circuit 330. The cathode terminal of D4 is coupled to the first terminal of the transistor N2. The second terminal of the transistor N2 is coupled to the sixth terminal 341 of the first driver circuit 330. In some examples, the control terminals of the transistors P1 and N1 are coupled to the second terminal 334 of the first driver circuit 330, and the control terminals of the transistors P2 and N2 are coupled to the third terminal 336 of the first driver circuit 330.

In the example of FIG. 3, the second driver circuit 342 includes transistors P3, N3, and diodes D5 and D6 in the arrangement shown. Each of the transistors P3 and N3 has a first terminal, a second terminal, and a control terminal. Each of the diodes D5 and D6 has an anode terminal and a cathode terminal. As shown, the first terminal of the transistors P3 is coupled to the first terminal 344 of the second driver circuit 342. The second terminal of the transistor P3 is coupled to the anode terminal of the diode D5. The cathode terminal of the diode D5 is coupled to fourth terminal 350 of the second driver circuit 342. The anode terminal of the diode D6 is coupled to the fifth terminal 352 of the second driver circuit 342. The cathode terminal of D6 is coupled to the first terminal of the transistor N3. The second terminal of the transistor N3 is coupled to the sixth terminal 354 of the second driver circuit 342. In some examples, the control terminal of the transistor P3 is coupled to the second terminal 346 of the second driver circuit 342, and the control terminal of the transistor N3 is coupled to the third terminal 348 of the second driver circuit 342.

In some examples, the CAN transceiver 226A operates to: receive $V_{CC}$ at its first terminal 228; if the STB signal is received at its second terminal 230, enter a low-power mode but ready to respond to a wake-up pattern received on the CAN bus lines; if the SHDN signal is received at its third terminal 232, enter an ultra-low power mode; in a normal mode, provide data at its fourth terminal 234 for the MCU 210 responsive to $V_{CC}$ and data received on the CAN bus lines; in a low-power mode, provide a wake-up signal at its fourth terminal 234 responsive to CAN bus lines data having a wake-up pattern; receive data from the MCU 210 at its fifth terminal 236 responsive to $V_{CC}$, select an operating mode (e.g., a fast data mode and a slow data mode), decode the receive data, and send the decoded data on the CAN bus lines; receive or transmit data via its sixth terminal 238 and its seventh terminal 240 based on differential signaling. When transmitting data to the CAN bus lines using the sixth terminal 238 and the seventh terminal 240, the CAN transceiver 226 may prepare the data to be transmitted based on information received at the fifth terminal 236 (the TXD terminal) and the second terminal 230 (the STB terminal). In different scenarios, the CAN transceiver 226A may use a fast data mode, a slow data mode, or a no drive mode in case of a receive mode or low-power mode. When receiving data from the CAN bus lines, the CAN transceiver 226A receives differential voltages at the fifth terminal 236 (the TXD terminal) and the second terminal 230 (the STB terminal). In a standby mode, the CAN transceiver 226A only responds to valid wake-up patterns received on the CAN bus lines. In a fast data mode (e.g., selected responsive to signaling at the fifth terminal 236), the CAN transceiver 226A may receive CAN-XL data from the CAN bus lines. In a slow data mode, the CAN transceiver 226A may receive CAN-FD data from the CAN bus lines.

In a low-power mode, the receiver circuitry 356 of the CAN transceiver 226A operates to: receive voltages from the CANH and CANL bus lines; detect a wake-up pattern; and provide a wake-up signal responsive to detecting the wake-up pattern. In a normal mode, the receiver circuitry 356 of the CAN transceiver 226A operates to: compare the voltages received from the CANH and CANL bus lines; and provide data at its fourth terminal responsive to the comparison results. In different scenarios, the operations of the CAN transceiver 226A may vary responsive to duty-cycle detection results on TXD signals, receipt of the STB signal, and/or receipt of the SHDN signals as described herein.

In the example of FIG. 3, the first buffer circuit 302 buffers the TXD signal for use by the control circuitry 314. The second buffer circuit 308 buffers the STB signal for use by the control circuitry 314. In some examples, the control circuitry 314 includes an analog duty-cycle detector circuit 244A and mode selection circuitry 326. The mode selection circuitry 326 may include, for example, period detection circuitry (e.g., transition detection and a counter) and a state machine or related logic. In operation, the control circuitry 314 operates to select a fast data mode, a slow data mode, a low-power mode, or an ultra-low power mode. In some examples, the analog duty-cycle detector circuit 244A is used to determine duty-cycle detection results for the TXD signal. The duty-cycle detection results may be used to decode data and generate data for the CAN bus lines and/or to adjust an operating mode of the CAN transceiver 226A. In some examples, the mode selection circuitry 326 may: receive the duty-cycle detection results from the analog duty-cycle detector circuit 244A; select a fast data mode or a slow data mode for the CAN transceiver 226A responsive to the duty-cycle detection results. Additionally, or alternatively, the mode selection circuitry 326 may operate to: detect the period of the TXD signal as part of selecting between the fast data mode and the slow data mode; select either a transmit mode or a receive mode based on the previous state of the TXD signal; and select either a low-power mode or a normal mode responsive to the STB signal and/or other control criteria.

In some examples, the first driver circuit 330 operates to generate differential signals to the CAN bus lines for fast data mode operations. In contrast, the second driver circuit 342 operates to generate differential signals to the CAN bus lines for slow data mode operations.

In some examples, the power management circuitry 370 includes bandgap voltage reference (BGR) circuitry, power-on reset (POR) circuitry, thermal shutdown (TSD) circuitry, and/or other power management options. In some examples, the BGR circuitry provides bias currents for other circuits of the CAN transceiver 226A. In some examples, the POR circuitry may perform power-on or reset operations for the CAN transceiver 226A. In some examples, the TSD circuitry operates to shut down the CAN transceiver 226A responsive to detecting that the temperature of the CAN transceiver 226A or an ambient temperature is above a threshold. The bias voltage circuitry 380 operates to bias the CAN bus output in static conditions.

Figure 4A:
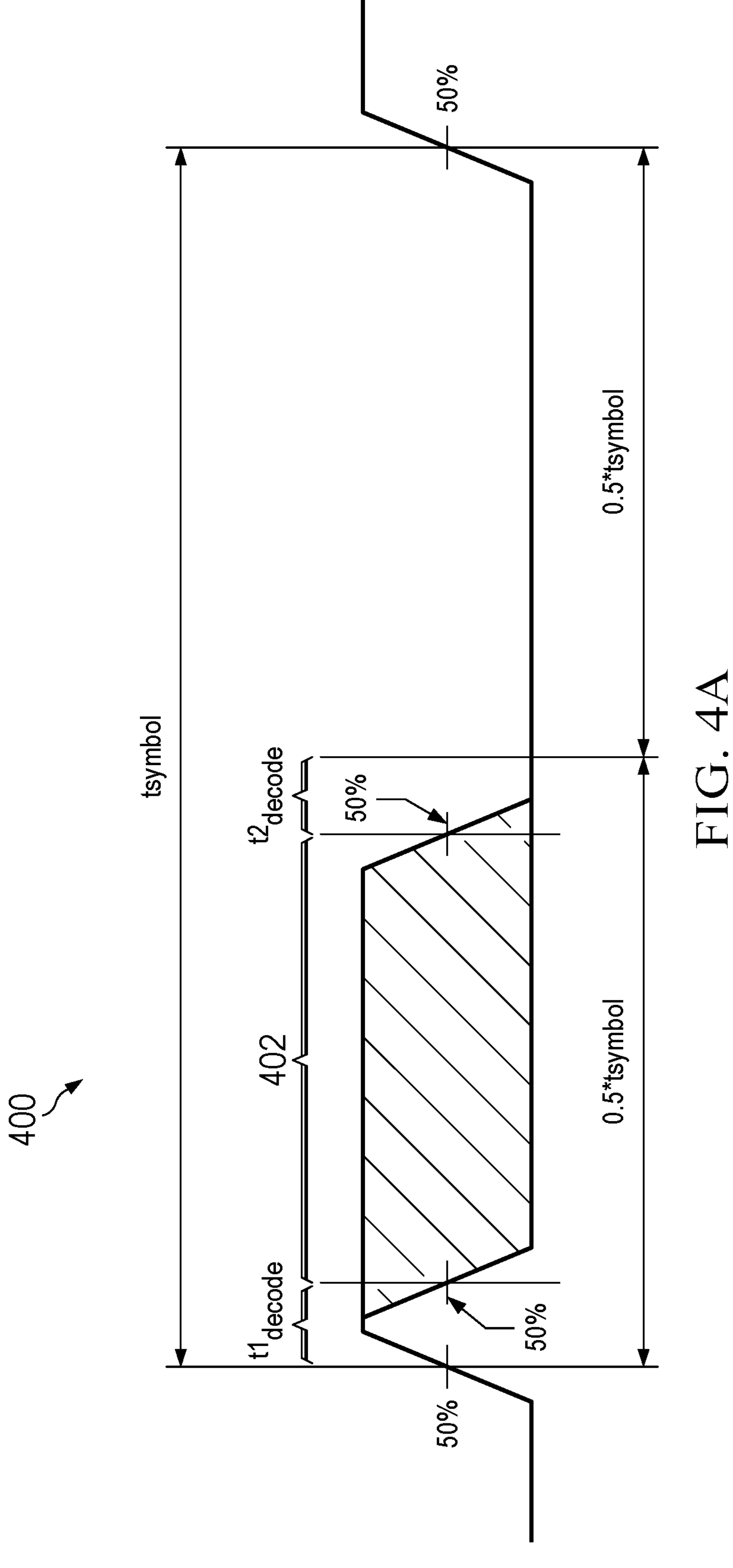
FIGS. 4A and 4B are diagrams showing duty-cycle detection parameters.
Figure 4B:
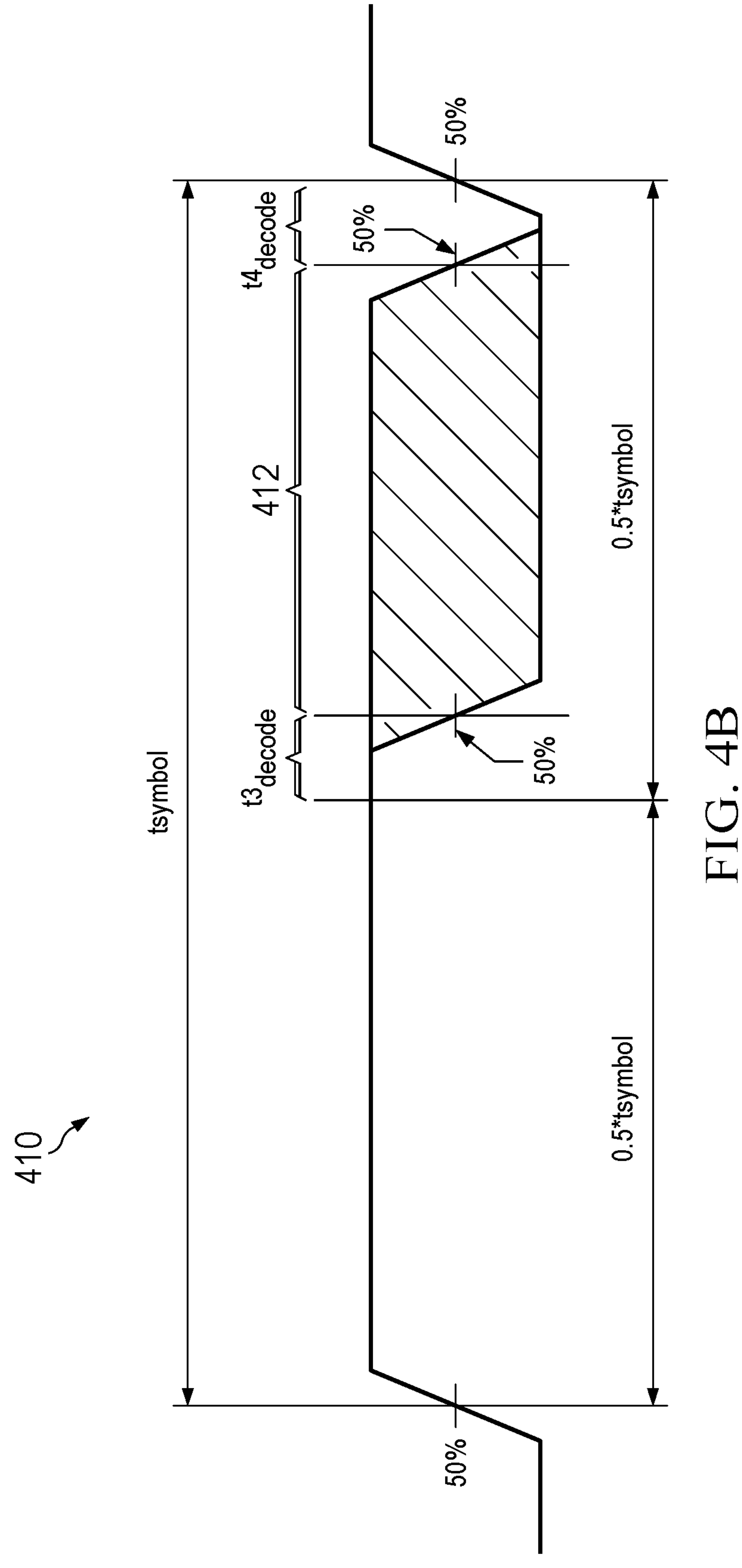

FIGS. 4A and 4B are diagrams 400 and 410 showing duty-cycle detection parameters. In the diagram 400 of FIG. 4A, duty-cycle detection parameters of logical 0 detection are represented. As shown, the diagram 400 includes the period of a symbol ($t_{symbol}$), a first half of $t_{symbol}$ (i.e., $0.5*t_{symbol}$), a second half of $t_{symbol}$ (i.e., $0.5*t_{symbol}$), a first decode interval ($t\mathbf{1}_{decode}$), a logical 0 detection interval 402, a second detection interval ($t\mathbf{2}_{decode}$), and a 50% threshold. For logical 0 detection, the logical 0 detection interval 402 begins in the first half of $t_{symbol}$ after $t\mathbf{1}_{decode}$, where $t\mathbf{1}_{decode}$ determines the resolution of duty-cycle detection. During the logical 0 detection interval 402, a signal value below the 50% threshold is detected by the analog duty-cycle detector circuit. After the logical 0 detection interval 402, $t\mathbf{2}_{decode}$ provides an interval to decode results from the logical 0 detection interval 402 and determines the resolution of duty-cycle detection. In the example of FIG. 4A, $t\mathbf{1}_{decode}$, the logical 0 detection interval 402, and $t\mathbf{2}_{decode}$ are in the first half of $t_{symbol}$. In different examples, the duration of $t\mathbf{1}_{decode}$, the logical 0 detection interval 402, and $t\mathbf{2}_{decode}$ may vary. In some examples, the duration of $t\mathbf{1}_{decode}$, the logical 0 detection interval 402, and $t\mathbf{2}_{decode}$ is based on a fixed or adjustable data rate. If the data rate is adjustable, the durations of $t\mathbf{1}_{decode}$, the logical 0 detection interval 402, and $t\mathbf{2}_{decode}$ may be adjustable or set for the highest data rate. To summarize, logical 0 detection involves detecting when the duty-cycle for $t_{symbol}$ is less than 50%.

In the diagram 410 of FIG. 4B, duty-cycle detection parameters of logical 1 detection are represented. As shown, the diagram 410 includes the period of a symbol ($t_{symbol}$), a first half of $t_{symbol}$ (i.e., $0.5*t_{symbol}$), a second half of $t_{symbol}$ (i.e., $0.5*t_{symbol}$), a third decode interval ($t\mathbf{3}_{decode}$), a logical 1 detection interval 412, a fourth detection interval ($t\mathbf{4}_{decode}$), and a 50% threshold. For logical 1 detection, the logical 1 detection interval 412 begins in the second half of $t_{symbol}$ after $t\mathbf{3}_{decode}$, where $t\mathbf{3}_{decode}$ determines the resolution of duty-cycle detection. During the logical 1 detection interval 412, a signal value above the 50% threshold is detected by the analog duty-cycle detector circuit. After the logical 1 detection interval 412, $t\mathbf{4}_{decode}$ provides an interval to decode results from the logical 1 detection interval 412 and determines the resolution of duty-cycle detection. In the example of FIG. 4B, $t\mathbf{3}_{decode}$, the logical 1 detection interval 402, and $t\mathbf{4}_{decode}$ are in the second half of $t_{symbol}$. In different examples, the duration of $t\mathbf{3}_{decode}$, the logical 1 detection interval 412, and $t\mathbf{4}_{decode}$ may vary. In some examples, the duration of $t\mathbf{3}_{decode}$, the logical 1 detection interval 412, and $t\mathbf{4}_{decode}$ is based on a fixed or adjustable data rate. If the data rate is adjustable, the durations of $t\mathbf{3}_{decode}$, the logical 1 detection interval 412, and $t\mathbf{2}_{decode}$ may be adjustable or set for the highest data rate. To summarize, logical 1 detection involves detecting when the duty-cycle for $t_{symbol}$ is greater than 50%.

Figure 5:
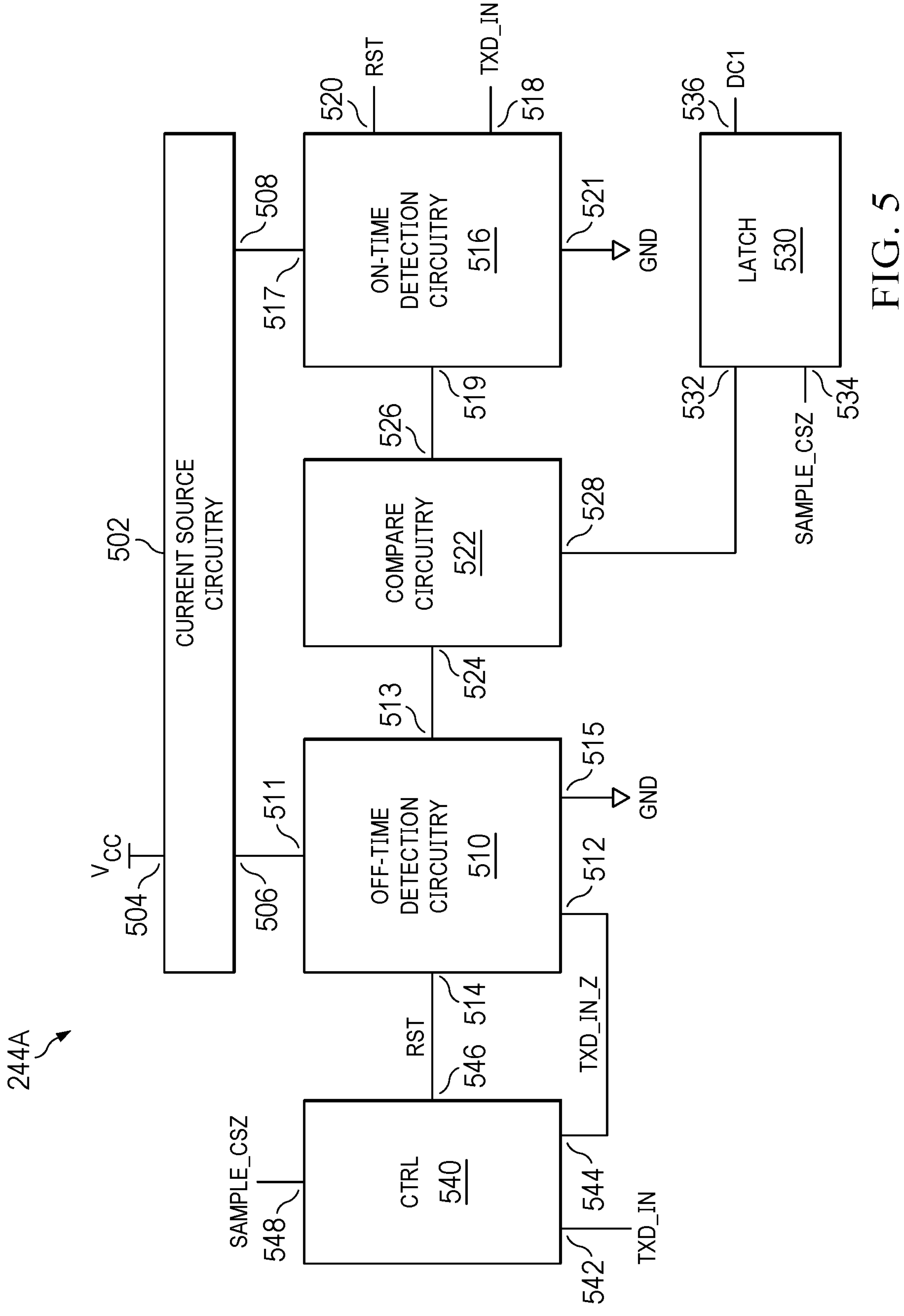
FIG. 5 is a block diagram showing an example analog duty-cycle detector circuit.

FIG. 5 is a block diagram showing an example analog duty-cycle detector circuit 244A. The analog duty-cycle detector circuit 244A is an example of the analog duty-cycle detector circuit 244 in FIGS. 2 and 3, or any of the analog duty-cycle detector circuits 126A to 126N in FIG. 1. In the example of FIG. 5, the analog duty-cycle detector circuit 244A includes current source circuitry 502, off-time detection circuitry 510, on-time detection circuitry 516, compare circuitry 522, a latch circuit 530, and a controller 540. The current source circuitry 502 has a first terminal 504, a second terminal 506, and a third terminal 508. The off-time detection circuitry 510 has a first terminal 511, a second terminal 512, a third terminal 513, a fourth terminal 514, and a fifth terminal 515. The on-time detection circuitry 516 has a first terminal 517, a second terminal 518, a third terminal 519, a fourth terminal 520, and a fifth terminal 521. The compare circuitry 522 has a first terminal 524, a second terminal 526, and a third terminal 528. The latch circuit 530 has a first terminal 532, a second terminal 534, and a third terminal 536. The controller 540 has a first terminal 542, a second terminal 544, a third terminal 546, and a fourth terminal 548.

In the example of FIG. 5, the first terminal 504 of the current source circuitry 502 is coupled to a power supply source (not shown) and receives a voltage supply ($V_{CC}$). The second terminal 506 of the current source circuitry 502 is coupled to the first terminal 511 of the off-time detection circuitry 510. The third terminal 508 of the current source circuitry 502 is coupled to the first terminal 517 of the on-time detection circuitry 516. The second terminal 512 of the off-time detection circuitry 510 is coupled to the second terminal 544 of the controller 540. The third terminal 513 of the off-time detection circuitry 510 is coupled to the first terminal 524 of the compare circuitry 522. The fourth terminal 514 of the off-time detection circuitry 510 is coupled to the third terminal 546 of the controller 540. The fifth terminal 515 of the off-time detection circuitry 510 is coupled to a ground terminal or ground.

The second terminal 518 of the on-time detection circuitry 516 is coupled to the first terminal 542 of the controller 540. The third terminal 519 of the on-time detection circuitry 516 is coupled to the second terminal 526 of the compare circuitry 522. The fourth terminal 520 of the on-time detection circuitry 516 is coupled to the third terminal 546 of the controller 540. The fifth terminal 521 of the on-time detection circuitry 516 is coupled to a ground terminal or ground.

The third terminal 528 of the compare circuitry 522 is coupled to the first terminal 532 of the latch circuit 530. The second terminal 534 of the latch circuit 530 is coupled to the fourth terminal 548 of the controller 540. The third terminal 536 of the latch circuit 530 provides a duty-cycle results signal (DC1).

In the example of FIG. 5, the current source circuitry 502 operates to: receive $V_{CC}$ at its first terminal 504; provide current to its second terminal 506 responsive to $V_{CC}$; and provide current to its third terminal 508 responsive to $V_{CC}$. In some examples, the current at the second terminal 506 and the current at the third terminal 508 are independent from each other. In other examples, the current at the second terminal 506 and the current at the third terminal 508 is a shared current. In such examples, the second terminal 506 and the third terminal 508 may be represented as one terminal or are otherwise connected.

The off-time detection circuitry 510 operates to: receive a current from the current source circuitry 502 at its first terminal 511; receive the inverse signal (TXD_IN_Z) of an transmit data signal (TXD_IN) at its second terminal 512; provide an off-time detection result at its third terminal 513 responsive to the received current and TXD_IN_Z; and reset responsive to receiving a reset signal (RST) at its fourth terminal 514. The on-time detection circuitry 516 operates to: receive a current from the current source circuitry 502 at its first terminal 517; receive the transmit data signal TXD_IN at its second terminal 518; provide an on-time detection result at its third terminal 519 responsive to the received current and TXD_IN; and reset responsive to receiving RST at its fourth terminal 520. In some examples, the input current and the components for the off-time detection circuitry 510 match the input current and the components of the on-time detection circuitry 516 so that any difference between the charge stored by the off-time detection circuitry 510 and the charge stored by the on-time detection circuitry 516 can be attributed to duty-cycle. By matching the input current and the components for the off-time detection circuitry 510 and the on-time detection circuitry 516, control signals are simplified as well (e.g., TXD_IN_Z can be easily generated from TXD_IN).

The compare circuitry 522 operates to: receive the off-time detection result at its first terminal 524; receive the on-time detection result at its second terminal 526; and provide a comparison result at its third terminal 528. The latch circuit 530 operates to: receive the comparison result at its first terminal 532; receive a sample control signal (SAMPLE_CSZ) at its second terminal 534; and provide a duty-cycle detection result (DC1) at its third terminal 536 responsive to the comparison results and SAMPLE_CSZ. The controller 540 operates to: receive TXD_IN at its first terminal 542; receive TXD_IN_Z at its second terminal 544; provide RST at its third terminal 546 responsive to TXD_IN, TXD_IN_Z, and/or timing criteria for $t_{symbol}$; and provide SAMPLE_CSZ at its fourth terminal 548 responsive to TXD_IN, TXD_IN_Z, and/or timing criteria for $t_{symbol}$.

Figure 6:
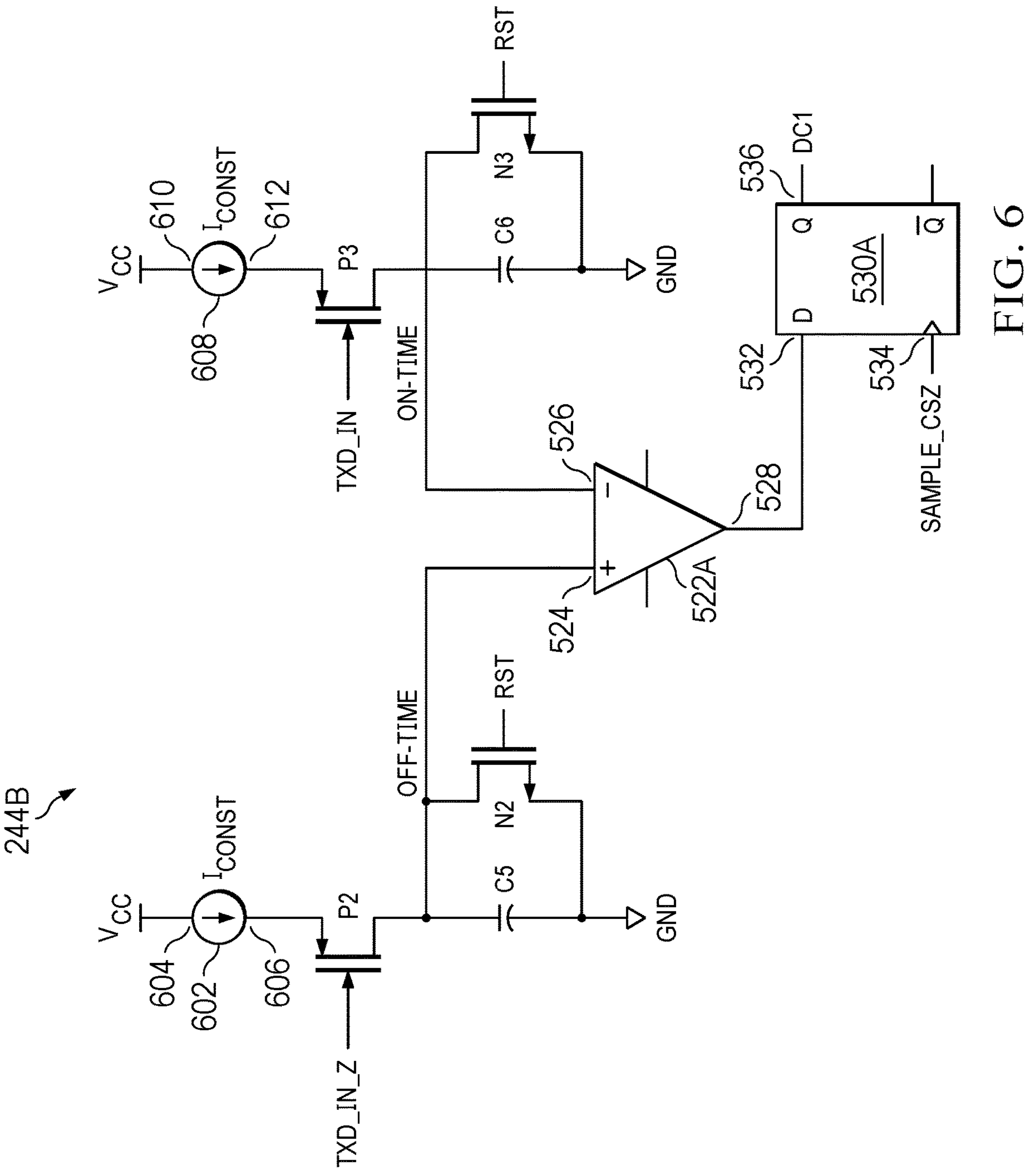
FIGS. 6 and 7 are diagrams showing example analog duty-cycle detector circuits.
Figure 7:
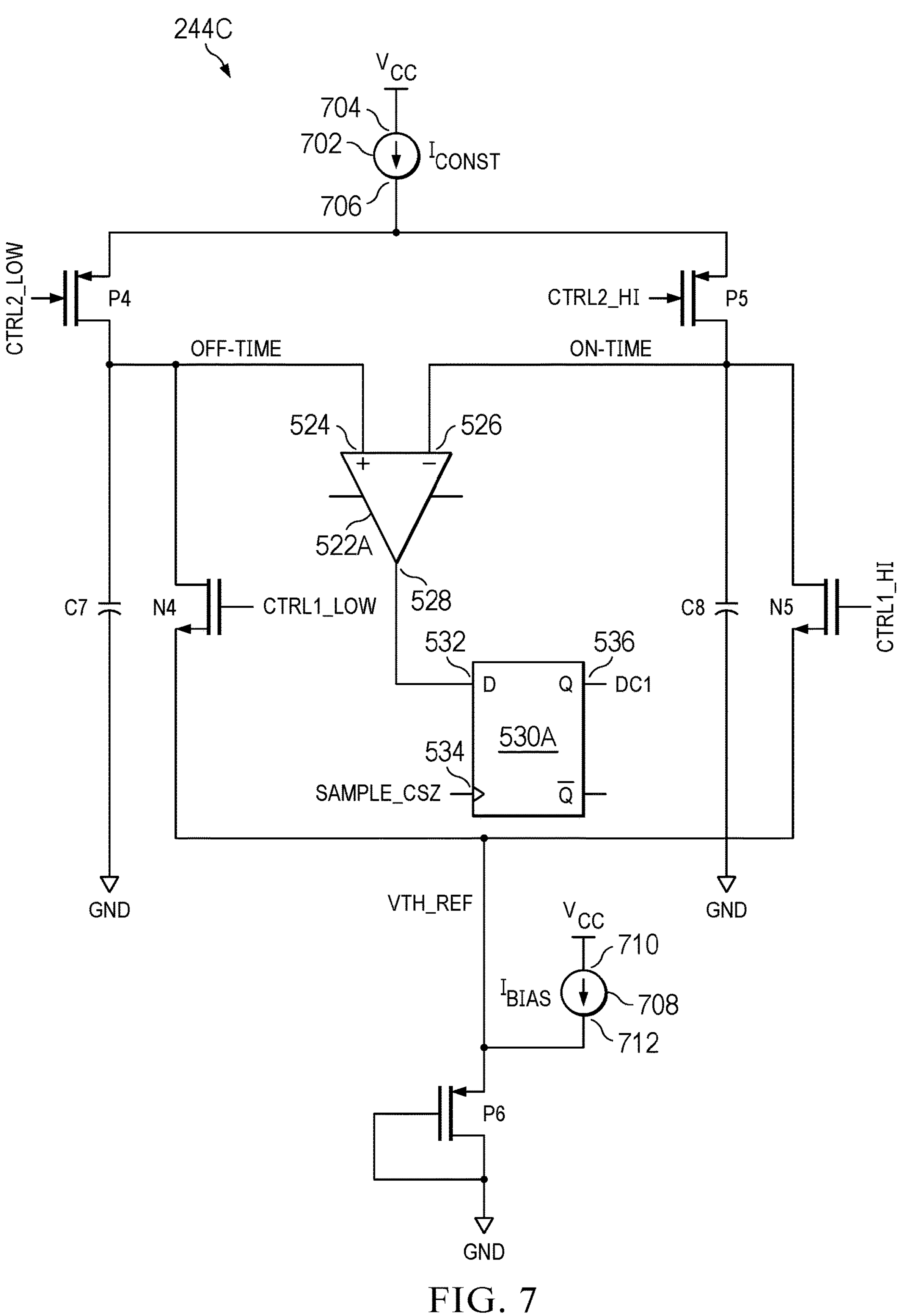

FIGS. 6 and 7 are diagrams showing example analog duty-cycle detector circuits 244B and 244C. The analog duty-cycle detector circuit 244B of FIG. 6 is an example of the analog duty-cycle detector circuit 244A of FIG. 5, the analog duty-cycle detector circuit 244 in FIGS. 2 and 3, or any of the analog duty-cycle detector circuits 126A to 126N in FIG. 1. The analog duty-cycle detector circuit 244C of FIG. 7 is an example of the analog duty-cycle detector circuit 244A of FIG. 5, the analog duty-cycle detector circuit 244 in FIGS. 2 and 3, or any of the analog duty-cycle detector circuits 126A to 126N in FIG. 1.

In the example of FIG. 6, the analog duty-cycle detector circuit 244B includes a first current source 602, a second current source 608, transistors P2, P3, N2, and N3, capacitors C5 and C6, a comparator 522A, and a latch circuit 530A in the arrangement shown. The comparator 522A is an example of the compare circuitry 522 in FIG. 5. The comparator 522A may be selected based on a target performance criteria such as speed and low input offset. In some examples, the comparator 522A may be a Strong-Arm comparator. In the example of FIG. 6, the latch circuit 530A is a D flip-flop and is an example of the latch circuit 530 in FIG. 5.

In the example of FIG. 6, the first current source 602 has a first terminal 604 and a second terminal 606. The second current source 608 has a first terminal 610 and a second terminal 612. Each of the transistors P2, N2, P3, and N3 has a respective first terminal, a respective second terminal, and a respective control terminal. Each of the capacitors C5 and C6 has a respective first terminal and a respective second terminal. The comparator 522A has the first terminal 524, the second terminal 526, and the third terminal 528 described in FIG. 5. The latch circuit 530A has the first terminal 532, the second terminal 534, and the third terminal 536 described in FIG. 5. In some examples, the first current source 602 and the second current source 608 are example components of the current source circuitry 502 in FIG. 5. The transistors P2 and N2, and the capacitor C5 are example components of the off-time detection circuitry 510 in FIG. 5. The transistors P3 and N3, and the capacitor C6 are example components of the on-time detection circuitry 516 in FIG. 5.

In the example of FIG. 6, the first terminal 604 of the first current source 602 is coupled to a $V_{CC}$ terminal. The second terminal 606 of the first current source 602 is coupled to the first terminal of the transistor P2. The control terminal of the transistor P2 is coupled to a controller (e.g., the controller 540 in FIG. 5) and receives TXD_IN_Z. The second terminal of the transistor P2 is coupled to the first terminal of the capacitor C5, the first terminal of the transistor N2, and the first terminal 524 of the comparator 522A. In some examples, the first terminal 524 of the comparator is a non-inverting ("+") terminal of the comparator 522A. The second terminal of the capacitor C5 is coupled to a ground terminal or ground. The second terminal of the transistor N2 is coupled to a ground terminal or ground. The control terminal of the transistor N2 is coupled to a controller (e.g., the controller 540 in FIG. 5) and receives RST.

The first terminal 610 of the second current source 608 is coupled to a $V_{CC}$ terminal. The second terminal 612 of the second current source 608 is coupled to the first terminal of the transistor P3. The control terminal of the transistor P3 is coupled to a controller (e.g., the controller 540 in FIG. 5) and receives TXD_IN. The second terminal of the transistor P3 is coupled to the first terminal of the capacitor C6, the first terminal of the transistor N3, and the second terminal 526 of the comparator 522A. In some examples, the second terminal 526 of the comparator is an inverting ("–") terminal of the comparator 522A. The second terminal of the capacitor C6 is coupled to a ground terminal or ground. The second terminal of the transistor N3 is coupled to a ground terminal or ground. The control terminal of the transistor N3 is coupled to a controller (e.g., the controller 540 in FIG. 5) and receives RST. The third terminal 528 of the comparator 522A is coupled to the first terminal 532 of the latch circuit 530A. The second terminal 534 of the latch circuit 530A is coupled to a controller (e.g., the controller 540 in FIG. 5) and receives SAMPLE_CSZ. The third terminal 536 of the latch circuit 530A provides DC1.

During an on-time detection interval, the transistor P3 is turned on by TXD_IN and the capacitor C6 is charged responsive to a constant current ($I_{CONST}$) provided by the second current source 608. After the on-time detection interval, the capacitor C6 maintains its charge with the transistors P3 and N3 turned off. The charge on the capacitor C6 after the on-time detection interval is the on-time detection results (ON_TIME). During an off-time detection interval, the transistor P2 is turned on by TXD_IN_Z and the capacitor C5 is charged responsive to a constant current ($I_{CONST}$) provided by the first current source 602. After the off-time detection interval, the capacitor C5 maintains its charge with the transistors P2 and N2 turned off. The charge on the capacitor C5 after the off-time detection interval is the off-time detection results (OFF_TIME). After the on-time and off-time detection intervals are complete, the comparator 522A compares ON-TIME and OFF-TIME. If ON-TIME is greater than OFF-TIME, the comparator 522A outputs a logical 1. Otherwise, the comparator outputs a logical 0. The latch circuit 530A samples the output of the comparator 522A responsive to SAMPLE_CSZ. SAMPLE_CSZ is asserted, for example, at the end of each period ($t_{symbol}$). As used herein, a signal that is "asserted" refers to the signal having a voltage level above a threshold. Meanwhile, a signal that is "de-asserted" refers to the signal having a voltage level below the threshold. In other words, an asserted signal is interpreted as a logical 1 and a de-asserted signal is interpreted as a logical 0. After each decode interval is complete, the duty-cycle detection circuit 244B is reset using RST. During reset, the transistors N2 and N3 are turned on to discharge the capacitors C5 and C6. In some examples, two reset signals may be used. In other examples, a single reset signal is used.

In the example of FIG. 7, the analog duty-cycle detector circuit 244C includes a first current source 702, a second current source 708, transistors P4, P5, P6, N4, and N5, capacitors C7 and C8, the comparator 522A, and the latch circuit 530A in the arrangement shown. The first current source 702 has a first terminal 704 and a second terminal 706. The second current source 708 has a first terminal 710 and a second terminal 712. Each of the transistors P4, P5, P6, N4, and N5 has a respective first terminal, a respective second terminal, and a respective control terminal. Each of the capacitors C7 and C8 has a respective first terminal and a respective second terminal. The comparator 522A has the first terminal 524, the second terminal 526, and the third terminal 528 described in FIG. 5. The latch circuit 530A has the first terminal 532, the second terminal 534, and the third terminal 536 described in FIG. 5. In some examples, the first current source 702 is an example component of the current source circuitry 502 in FIG. 5. The transistors P4 and N4, and the capacitor C7 are example components of the off-time detection circuitry 510 in FIG. 5. The transistors P5 and N5, and the capacitor C8 are example components of the on-time detection circuitry 516 in FIG. 5. The second current source 708 and the transistor P6 are used to provide threshold voltage reference (VTH_REF).

In the example of FIG. 7, the first terminal 704 of the first current source 702 is coupled to a $V_{CC}$ terminal. The second terminal 706 of the first current source 702 is coupled to the first terminal of the transistor P4. The control terminal of the transistor P4 is coupled to a controller (e.g., the controller 540 in FIG. 5) and receives a control signal CTRL2_LOW. The second terminal of the transistor P4 is coupled to the first terminal of the capacitor C7, the first terminal of the transistor N4, and the first terminal 524 of the comparator 522A. The control terminal of the transistor N4 is coupled to a controller (e.g., the controller 540 in FIG. 5) and receives a control signal CTRL1_LOW. The second terminal of the capacitor C7 is coupled to the first terminal of the transistor P6 and the second terminal 712 of the second current source 708. The first terminal 710 of the second current source 708 is coupled to a $V_{CC}$ terminal. The second terminal and the control terminal of the transistor P6 are coupled to a ground terminal or ground. With the second current source 708 and the transistor P6, the capacitor C7 can be reset to VTH_REF rather than ground.

The accuracy of duty-cycle detection results depends on the level of matching between on-time detection circuitry and off-time detection circuitry. With regard to FIG. 7, matching of the capacitors C7 and C8 helps to improve the accuracy of duty-cycle detection results. In some examples, the capacitors C7 and C8 are poly-Nwell capacitors. Such poly-Nwell capacitors match best when biased in their accumulation regions, and the matching degrades in their depletion or inversion regions. To facilitate the capacitors C7 and C8 being in their accumulation regions, they are discharged during reset to VTH_REF rather than all the way to ground. In some examples, VTH_REF is maintained equal to the threshold voltage of a p-channel metal-oxide semiconductor (PMOS) transistor.

As shown, the second terminal 706 of the first current source 702 is also coupled to the first terminal of the transistor P5. The control terminal of the transistor P5 is coupled to a controller (e.g., the controller 540 in FIG. 5) and receives CTRL2_HI. The second terminal of the transistor P5 is coupled to the first terminal of the capacitor C8, the first terminal of the transistor N5, and the second terminal 526 of the comparator 522A. The control terminal of the transistor N5 is coupled to a controller (e.g., the controller 540 in FIG. 5) and receives a control signal CTRL1_HI. The second terminal of the capacitor C8 is coupled to a ground terminal or ground. The second terminal of the transistor N5 is coupled to the first terminal of the transistor P6 and the second terminal 712 of the second current source 708. With the second current source 708 and the transistor P6, the capacitor C8 can be reset to VTH_REF rather than ground.

In the example of FIG. 7, particular control sequences for CTRL1_LOW, CTRL2_LOW, CTRL1_HI, and CTRL2_HI may be used to facilitate accuracy of duty-cycle detection. In some examples, responsive to TXD_IN_Z being asserted, CTRL2_LOW turns on the transistor P4 after CTRL1_LOW turns off the transistor N4. In other examples, responsive to TXD_IN_Z being asserted, CTRL2_LOW turns on the transistor P4 before CTRL1_LOW turns off the transistor N4. In such examples, parasitic capacitance charge at the second terminal 706 of the first current source 702 is discharged to ground to avoid charge sharing between C7 and the parasitic capacitance. The control scheme for CTRL1_LOW and CTRL2_LOW may be referred to as a "make-before-break" scheme. Without discharging the parasitic capacitance charge, this residual charge can either cause some error in the duty-cycle detection results or needs to be accounted for (e.g., subtracted from the total charge on C7).

In some examples, responsive to TXD_IN_Z being de-asserted, CTRL2_HI turns on the transistor P5 after CTRL1_HI turns off the transistor N5. In other examples, responsive to TXD_IN_Z being de-asserted, CTRL2_HI turns on the transistor P5 before CTRL1_HI turns off the transistor N5. In such examples, parasitic capacitance charge at the second terminal 706 of the first current source 702 is discharged to ground to avoid charge sharing between C8 and the parasitic capacitance. The control scheme for CTRL1_HI and CTRL2_HI may be referred to as a "make-before-break" scheme. Without discharging the parasitic capacitance charge, this residual charge can either cause some error in the duty-cycle detection results or needs to be accounted for (e.g., subtracted from the total charge on C8).

In some examples, when TXD_IN_Z is de-asserted, CTRL2_LOW is de-asserted, and CTRL2_HI is asserted. To avoid C7 and C8 being shorted together briefly, an offset blanking period may be added between the transitions of CTRL2_LOW and CTRL2_HI. For example, when TXD_IN_Z is de-asserted, CTRL2_LOW may be de-asserted and then, after a short time, CTRL2_HI is asserted. In this manner, shorting the capacitors C7 and C8 together is avoided. Without careful control of CTRL2_LOW and CTRL2_HI, charge sharing between the two caps may occur, resulting in some error in the duty-cycle detection results. Similar to the offset between the assertion of TXD_IN and the subsequent assertion of CTRL2_HI, there may be an offset between assertion of TXD_IN_Z and the subsequent assertion of CTRL2_LOW to avoid or reduce error in the duty-cycle detection results.

During an on-time detection interval, the transistor P5 is turned on by CTRL2_HI, and the capacitor C8 is charged responsive to a constant current ($I_{CONST}$) provided by the first current source 702. After the on-time detection interval, the capacitor C8 maintains its charge with the transistors P5 and N5 turned off. The charge on the capacitor C8 after the on-time detection interval is the on-time detection results (ON_TIME). During an off-time detection interval, the transistor P4 is turned on by CTRL2_LOW, and the capacitor C7 is charged responsive to a constant current ($I_{CONST}$) provided by the first current source 702. After the off-time detection interval, the capacitor C7 maintains its charge with the transistors P4 and N4 turned off. The charge on the capacitor C7 after the off-time detection interval is the off-time detection results (OFF_TIME). After the on-time and off-time detection intervals are complete, the comparator 522A compares ON-TIME and OFF-TIME. If ON-TIME is greater than OFF-TIME, the comparator 522A outputs a logical 1. Otherwise, the comparator outputs a logical 0. The latch circuit 530A samples the output of the comparator 522A responsive to SAMPLE_CSZ. SAMPLE_CSZ is asserted when TXD_IN is de-asserted. After each decode interval is complete, the duty-cycle detector circuit 244B is reset using CTRL1_LOW and CTRL1_HI. During reset, the transistors N4 and N5 are turned on to discharge the capacitors C7 and C8 to VTH_REF. By resetting the charge on the capacitors C7 and C8 to VTH_REF, the analog duty-cycle detector circuit 244C biases the capacitors C7 and C8 to their accumulation regions for better matching and, thus, less error in the duty-cycle detection results.

Figure 8:
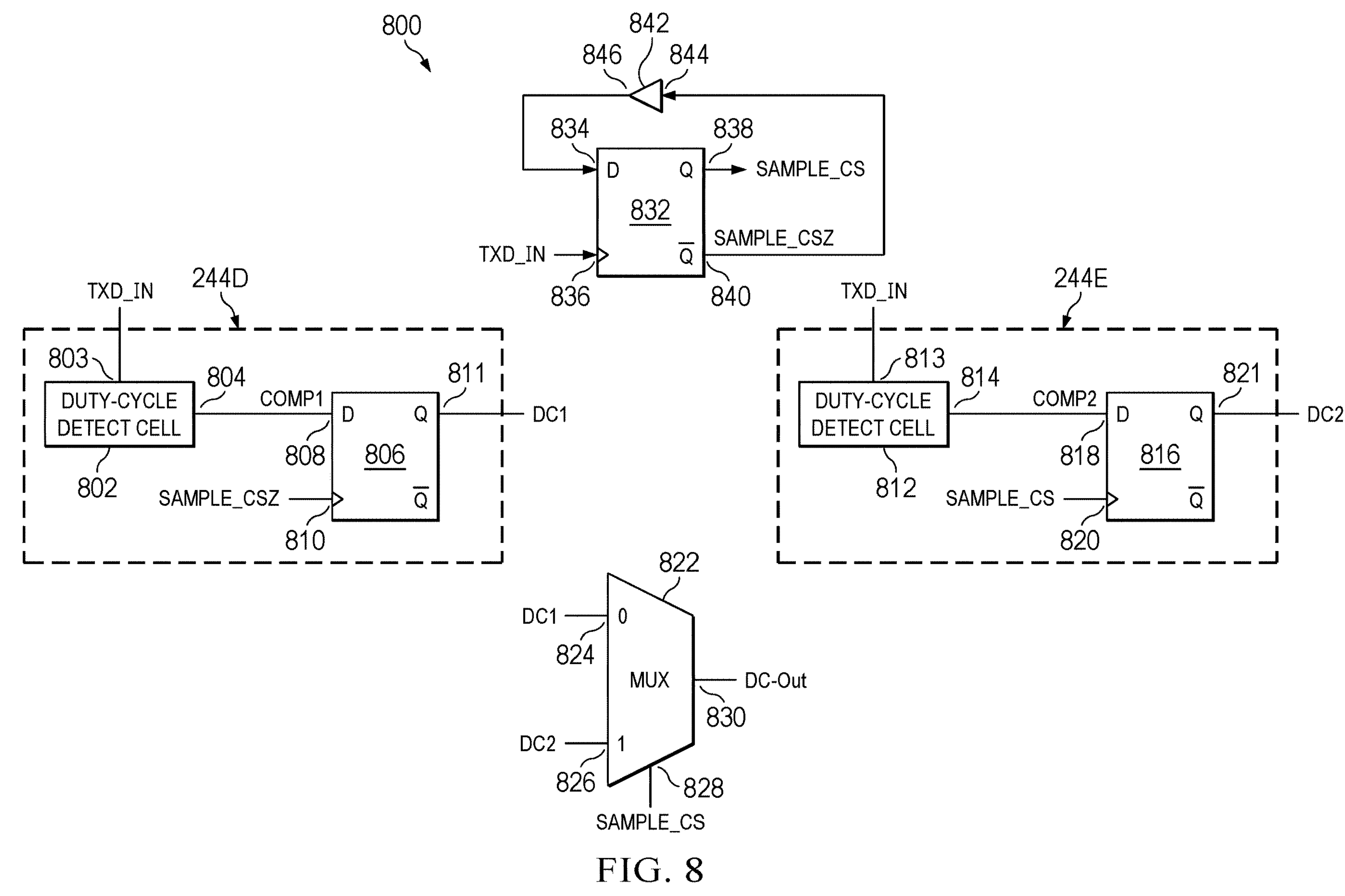
FIG. 8 is a diagram showing an example analog duty-cycle detector system.

FIG. 8 is a diagram of an analog duty-cycle detector system 800. In the example of FIG. 8, the analog duty-cycle detector system 800 includes a first analog duty-cycle detector circuit 244D, a second analog duty-cycle detector circuit 244E, a multiplexer 822, a latch circuit 832, and a delay circuit 842. Each of the first analog duty-cycle detector circuit 244D and the second analog duty-cycle detector circuit 244E are examples of the analog duty-cycle detector circuit 244 in FIGS. 2 and 3, the analog duty-cycle detector circuit 244A in FIG. 5, the analog duty-cycle detector circuit 244B in FIG. 6, or the analog duty-cycle detector circuit 244C in FIG. 7.

As shown, the first analog duty-cycle detector circuit 244D includes a first duty-cycle detect cell 802 and a first latch circuit 806. As used herein, a "duty-cycle detect cell" refers to a portion or sub-circuit of a duty-cycle detect circuit such as the first analog duty-cycle detector circuit 244D. Each duty-cycle detect cell provides on-time results and/or off-time results. To obtain duty-cycle detection results, the on-time results and/or off-time results of multiple duty-cycle detect cells may be further processed, latched, and combined as described herein.

The second analog duty-cycle detector circuit 244E includes a second duty-cycle detect cell 812 and a second latch circuit 816. Each of the first duty-cycle detect cell 802 and the second duty-cycle detect cell 812 may include, for example, the current source circuitry 502, off-time detection circuitry 510, on-time detection circuitry 516, and compare circuitry 522. A controller (e.g., the controller 540 in FIG. 5) may be included for each of the first duty-cycle detect cell 802 or the second duty-cycle detect cell 812. As another option, the first duty-cycle detect cell 802 and the second duty-cycle detect cell 812 may share a controller.

In the example of FIG. 8, the first duty-cycle detect cell 802 has a first terminal 803 and a second terminal 804. The first latch circuit 806 has a first terminal 808, a second terminal 810, and a third terminal 811. The second duty-cycle detect cell 812 has a first terminal 813 and a second terminal 814. The second latch circuit 816 has a first terminal 818, a second terminal 820, and a third terminal 821. The multiplexer 822 has a first terminal 824, a second terminal 826, a third terminal 828, and a fourth terminal 830. The latch circuit 832 has a first terminal 834, a second terminal 836, a third terminal 838, and a fourth terminal 840. The delay circuit 842 has a first terminal 844 and a second terminal 846. In operation, the latch circuit 832 is used to provide a frequency divider on the TXD_IN signal such that SAMPLE_CS goes high and low on alternate periods of TXD_IN. This enables two analog duty-cycle detector circuits, such as the first and second analog duty-cycle detector circuits 224D and 244E, to be operated in tandem. As used herein, "operated in tandem" refers to alternating operations of the first and second analog duty-cycle detector circuits 224D and 244E in non-overlapping time intervals and combining the results to obtain analog duty-cycle detection results.

As shown, the first terminal 803 of the first duty-cycle detect cell 802 receives TXD_IN. The second terminal 804 of the first duty-cycle detect cell 802 is coupled to the first terminal 808 of the first latch circuit 806. The second terminal 810 of the first latch circuit 806 receives SAMPLE_CSZ. The third terminal 811 of the first latch circuit 806 provides duty-cycle detection results (DC1) responsive to TXD_IN, the operations of the first duty-cycle detect cell 802, SAMPLE_CSZ, and the operations of the first latch circuit 806.

The first terminal 813 of the second duty-cycle detect cell 812 receives TXD_IN. The second terminal 814 of the second duty-cycle detect cell 812 is coupled to the first terminal 818 of the second latch circuit 816. The second terminal 820 of the second latch circuit 816 receives a sample control signal (SAMPLE_CS). The third terminal 821 of the second latch circuit 816 provides duty-cycle detection results (DC2) responsive to TXD_IN, the operations of the second duty-cycle detect cell 812, SAMPLE_CS, and the operations of the second latch circuit 816.

The first terminal 824 of the multiplexer 822 is coupled to the third terminal 811 of the first latch circuit 806. The second terminal 826 of the multiplexer 822 is coupled to the third terminal 821 of the second latch circuit 816. The third terminal 828 of the multiplexer 822 is coupled to the third terminal 838 of the latch circuit 832 and receives SAMPLE_CS. The fourth terminal 830 of the multiplexer 822 provides duty-cycle detection results (DC-Out) that combine DC1 from the first analog duty-cycle detector circuit 244D and DC2 from the second analog duty-cycle detector circuit 244E.

In the example of FIG. 8, the first terminal 834 of the latch circuit 832 is coupled to the second terminal 846 of the delay circuit 842. The first terminal 844 of the delay circuit 842 is coupled to the fourth terminal 840 of the latch circuit 832. In some examples, the latch circuit 832 operates to: receive a delayed version of SAMPLE_CSZ at its first terminal 834; receive TXD_IN at its second terminal 836; provide SAMPLE_CS at its third terminal 838 responsive to delayed version of SAMPLE_CSZ and TXD_IN; and provide SAMPLE_CSZ responsive to the previous delayed version of SAMPLE_CSZ and TXD_IN.

By using the first analog duty-cycle detector circuit 244D and the second analog duty-cycle detector circuit 244E, the analog duty-cycle detector system 800 is able to perform duty-cycle detection operations more quickly. In other words, while the first analog duty-cycle detector circuit 244D is in use, the second analog duty-cycle detector circuit 244E may be reset and vice versa. In some examples, multiple analog duty-cycle detector circuits as in FIG. 8 are used to account for the time needed to reset the capacitors. Without multiple analog duty-cycle detector circuits, duty-cycle detection errors may be increased and/or the duty-cycle detection inaccuracy increases.

Figure 9:
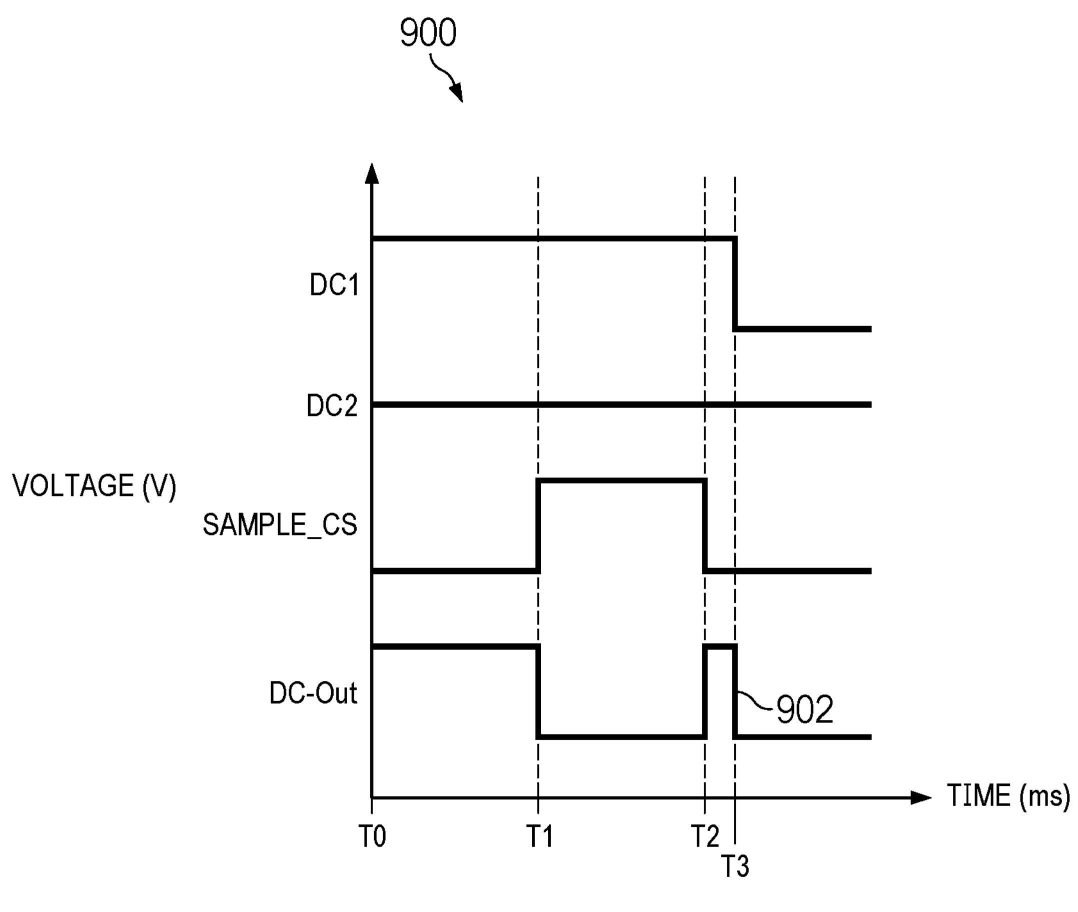
FIGS. 9 to 11 are timing diagrams showing example duty-cycle detector signals.
Figure 10:
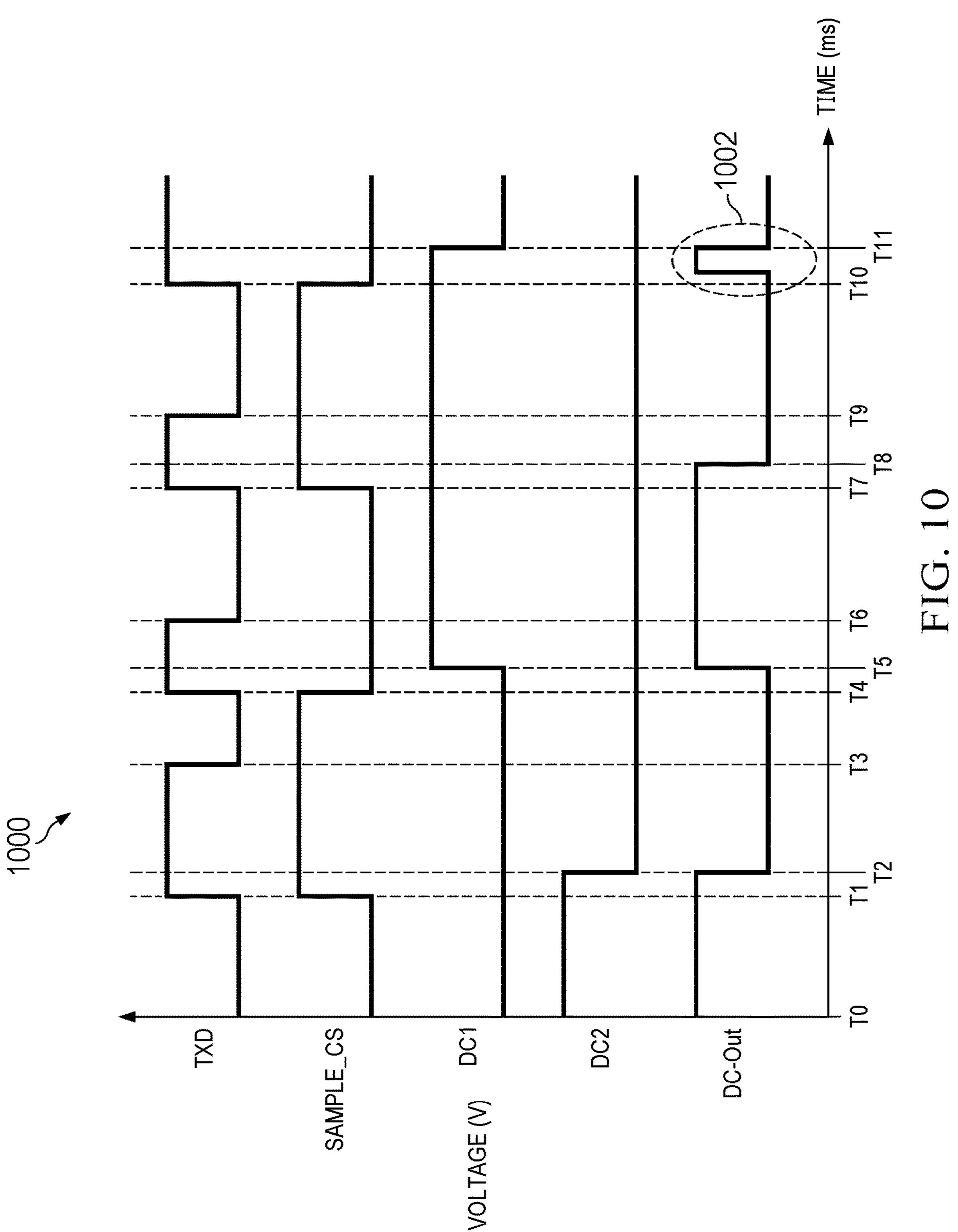
Figure 11:
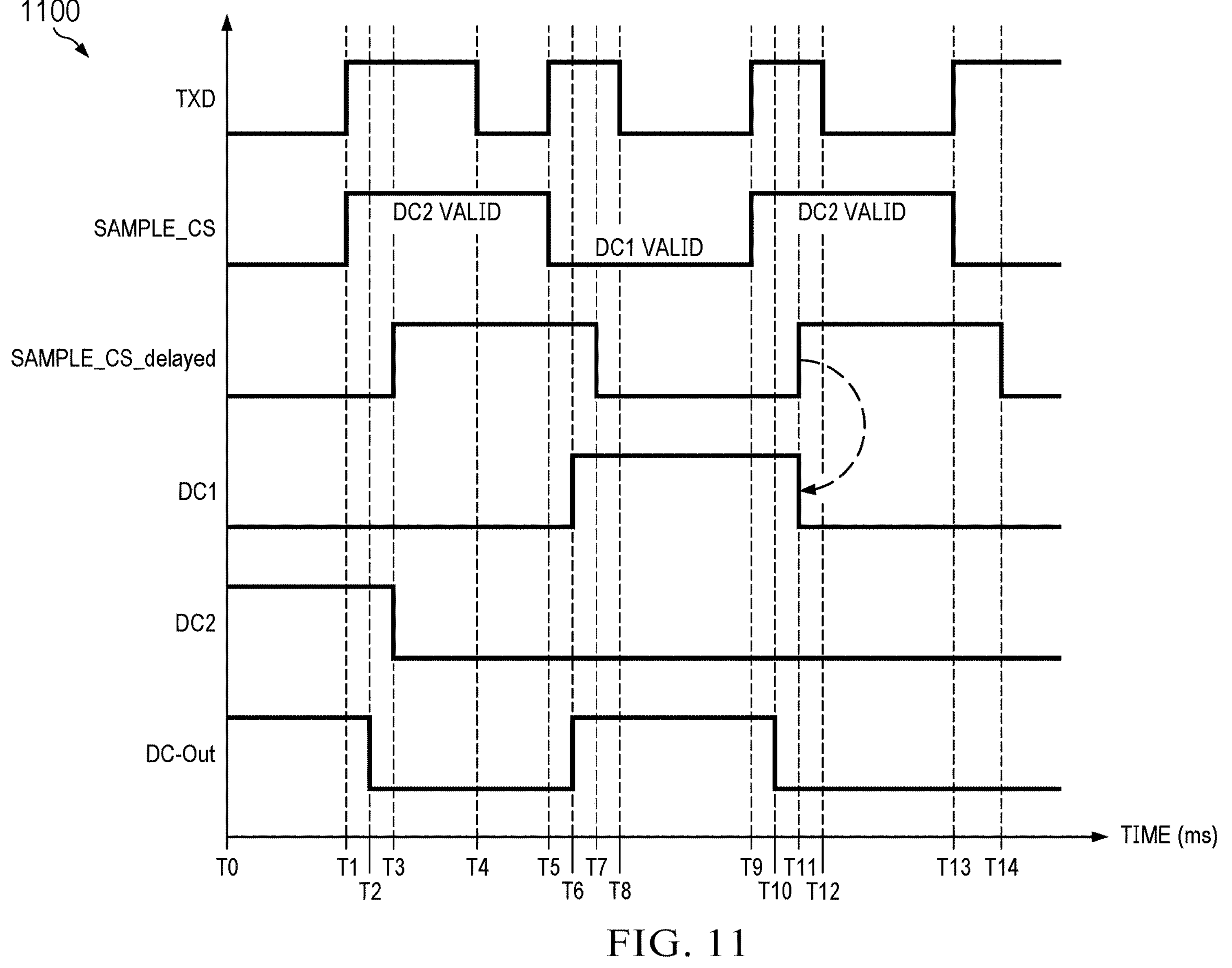

FIGS. 9 to 11 are timing diagrams 900, 1000, and 1100 showing example duty-cycle detection signals. In the timing diagram 900 of FIG. 9, the duty-cycle detection signals include DC1, DC2, SAMPLE_CS and DC-Out. In an ideal scenario, DC-Out combines DC1 and DC2 responsive to SAMPLE_CS. In some examples, when SAMPLE_CS is de-asserted, DC-Out equals DC1. When SAMPLE_CS is asserted, DC-Out equals DC2. In the timing diagram 900, a glitch 902 resulting from delays in responding to changes in SAMPLE_CS is shown. If the duty-cycle detection results are used for data decode, the glitch 902 may result in incorrect data decode results. If the duty-cycle detection results are used for mode selection, the glitch 902 may result in an incorrect mode selection.

In the timing diagram 1000 of FIG. 10, the duty-cycle detection signals include TXD, SAMPLE_CS, DC1, DC2, and DC-Out. Ideally, DC-Out combines DC1 and DC2 responsive to SAMPLE_CS. In the timing diagram 1000, a glitch 1002 resulting from delays in responding to changes in SAMPLE_CS is shown.

The glitch in the timing diagram 1000 is due to DC1 being immediately assigned to DC_Out at the falling edge of SAMPLE_CS even though the duty-cycle determination operations related to DC1 are not yet finalized. One solution could be to assign DC1 to DC-Out after a finite delay to allow DC1 time to settle. However, because this delay is not correlated to the related duty-cycle detect cell itself, the delay would have to be designed to be higher than the maximum delay that the related duty-cycle detect cell can have. That results in unnecessarily increasing the transmit path delay.

In some examples, the previous value of the DC2 latch circuit (e.g., the second latch circuit 816 in FIG. 8) is assigned to the DC1 latch circuit some time after the rising edge of SAMPLE_CS. When SAMPLE_CS is high, the capacitors used to determine DC1 are supposed to be in a reset state. Setting DC1 to DC2 ensures that when SAMPLE_CS goes low, DC1 is assigned to DC-Out, resulting in monotonicity of the DC-Out signal. With this technique, when the DC1 latch circuit changes its state, the output value is directly passed to DC-Out without any additional delay.

In the timing diagram 1100 of FIG. 11, the duty-cycle detection signals include TXD, SAMPLE_CS, SAMPLE_CS_delayed, DC1, DC2, and DC-Out. In the timing diagram 1100, glitches are avoided by using SAMPLE_CS_delayed to control DC1 and DC2 transitions instead of SAMPLE_CS.

Figure 12:
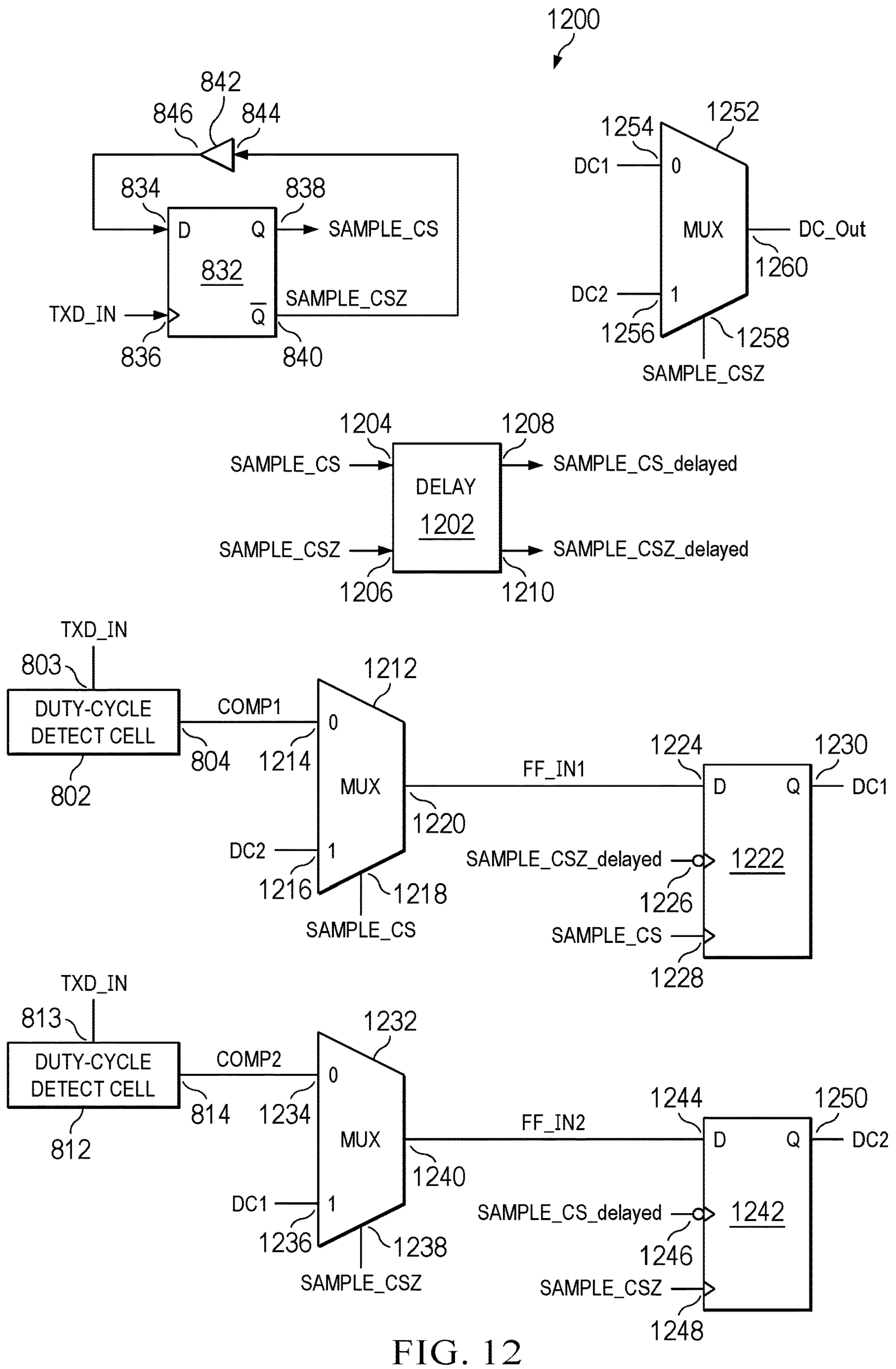
FIG. 12 is a diagram showing an example analog duty-cycle detector circuit with glitch reduction.

FIG. 12 is a diagram showing an example analog duty-cycle detector circuit 1200 with glitch reduction. The analog duty-cycle detector circuit 1200 includes the duty-cycle detect cell 802, the duty-cycle detect cell 812, the latch circuit 832, and the delay circuit 842 described in FIG. 8. In addition, the analog duty-cycle detector circuit 1200 includes a delay circuit 1202, multiplexer 1212, 1232, and 1252, and latch circuits 1222 and 1242. For the duty-cycle detect cell 802, the duty-cycle detect cell 812, the latch circuit 832, and the delay circuit 842 in FIG. 12, the description of FIG. 8 applies.

The delay circuit 1202 has a first terminal 1204, a second terminal 1206, a third terminal 1208, and a fourth terminal 1210. The multiplexer 1212 has a first terminal 1214, a second terminal 1216, a third terminal 1218, and a fourth terminal 1220. The multiplexer 1232 has a first terminal 1234, a second terminal 1236, a third terminal 1238, and a fourth terminal 1230. The multiplexer 1252 has a first terminal 1254, a second terminal 1256, a third terminal 1258, and a fourth terminal 1260. The latch circuit 1222 has a first terminal 1224, a second terminal 1226, a third terminal 1228, and a fourth terminal 1230. The latch circuit 1242 has a first terminal 1244, a second terminal 1246, a third terminal 1248, and a fourth terminal 1250.

In the example of FIG. 12, the first terminal 1204 of the delay circuit 1202 is coupled to the third terminal 838 of the latch circuit 832. The second terminal 1206 of the delay circuit 1202 is coupled to the fourth terminal 840 of the latch circuit 832. The first terminal 1214 of the multiplexer 1212 is coupled to the second terminal 804 of the first duty-cycle detect cell 802. The second terminal 1216 of the multiplexer 1212 is coupled to the fourth terminal 1250 of the latch circuit 1242. The third terminal 1218 of the multiplexer 1212 is coupled to the third terminal 838 of the latch circuit 832. The fourth terminal 1220 of the multiplexer 1212 is coupled to the first terminal 1224 of the latch circuit 1222. The second terminal 1226 of the latch circuit 1222 is coupled to the fourth terminal 1210 of the delay circuit 1202. The third terminal 1228 of the latch circuit 1222 is coupled to the third terminal 838 of the latch circuit 832.

The first terminal 1234 of the multiplexer 1232 is coupled to the second terminal 814 of the second duty-cycle detect cell 812. The second terminal 1236 of the multiplexer 1232 is coupled to fourth terminal 1230 of the latch circuit 1222. The third terminal 1238 of the multiplexer 1232 is coupled to the fourth terminal 840 of the latch circuit 832. The fourth terminal 1240 of the multiplexer 1232 is coupled to the first terminal 1244 of the latch circuit 1242. The second terminal 1246 of the latch circuit 1242 is coupled to the third terminal 1208 of the delay circuit 1202. The third terminal 1248 of the latch circuit 1242 is coupled to the fourth terminal 840 of the latch circuit 832. The first terminal 1254 of the multiplexer 1252 is coupled to the fourth terminal 1230 of the latch circuit 1222. The second terminal 1256 of the multiplexer 1252 is coupled to the fourth terminal 1250 of the latch circuit 1242. The third terminal 1258 of the multiplexer 1252 is coupled o the fourth terminal 840 of the latch circuit 832.

In some examples, the latch circuit 832 operates to: receive a delayed version of SAMPLE_CSZ at its first terminal 834; receive TXD_IN at its second terminal 836;

provide SAMPLE_CS at its third terminal 838 responsive to delayed version of SAMPLE_CSZ and TXD_IN; and provide SAMPLE_CSZ responsive to the previous delayed version of SAMPLE_CSZ and TXD_IN. In some examples, the delay circuit 1202 operates to: receive SAMPLE_CS at its first terminal 1204; receive SAMPLE_CSZ at its second terminal 1206; provide SAMPLE_CS_delayed at its third terminal 1208 responsive to SAMPLE_CS and a fixed or adjustable delay; and provide SAMPLE_CSZ_delayed at its fourth terminal 1210 responsive to SAMPLE_CSZ and a fixed or adjustable delay.

As described in FIG. 8, the first duty-cycle detect cell 802 operates to: receive TXD_IN at its first terminal 803; and provide COMP1 at its second terminal 804 responsive to TXD_IN. The multiplexer 1212 operates to: receive COMP1 at its first terminal 1214; receive DC2 at its second terminal 1216; receive SAMPLE_CS at its third terminal 1218; and provide a feedforward signal (FF_IN1) at its fourth terminal 1220 responsive to COMP1, DC2, and SAMPLE_CS. When SAMPLE_CS is de-asserted, FF_IN1 is equal to COMP1. When SAMPLE_CS is asserted, FF_IN1 is equal to DC2. The latch circuit 1222 operates to: receive FF_IN1 at its first terminal 1224; receive SAMPLE_CSZ_delayed at its second terminal 1226; receive SAMPLE_CS at its third terminal 1228; and provide DC1 at its fourth terminal 1230 responsive to FF_IN1, SAMPLE_CSZ_delayed, and SAMPLE_CS.

The second duty-cycle detect cell 812 operates to: receive TXD_IN at its first terminal 813; and provide COMP2 at its second terminal 814 responsive to TXD_IN. The multiplexer 1232 operates to: receive COMP2 at its first terminal 1234; receive DC1 at its second terminal 1236; receive SAMPLE_CSZ at its third terminal 1238; and provide a feedforward signal (FF_IN2) at its fourth terminal 1230 responsive to COMP2, DC1, and SAMPLE_CSZ. When SAMPLE_CSZ is de-asserted, FF_IN2 is equal to COMP2. When SAMPLE_CSZ is asserted, FF_IN2 is equal to DC1. The latch circuit 1242 operates to: receive FF_IN2 at its first terminal 1244; receive SAMPLE_CS_delayed at its second terminal 1246; receive SAMPLE_CSZ at its third terminal 1238; and provide DC2 at its fourth terminal 1250 responsive to FF_IN2, SAMPLE_CS_delayed, and SAMPLE_CSZ.

The multiplexer 1252 operates to: receive DC1 at its first terminal 1254; receive DC2 at its second terminal 1256; receive SAMPLE_CSZ at its third terminal 1258; and provide DC_Out at its fourth terminal 1260 responsive to DC1, DC2, and SAMPLE_CSZ. With the analog duty-cycle detector circuit 1200, the glitch issues described in FIGS. 9 and 10 are avoided.

Figure 13:
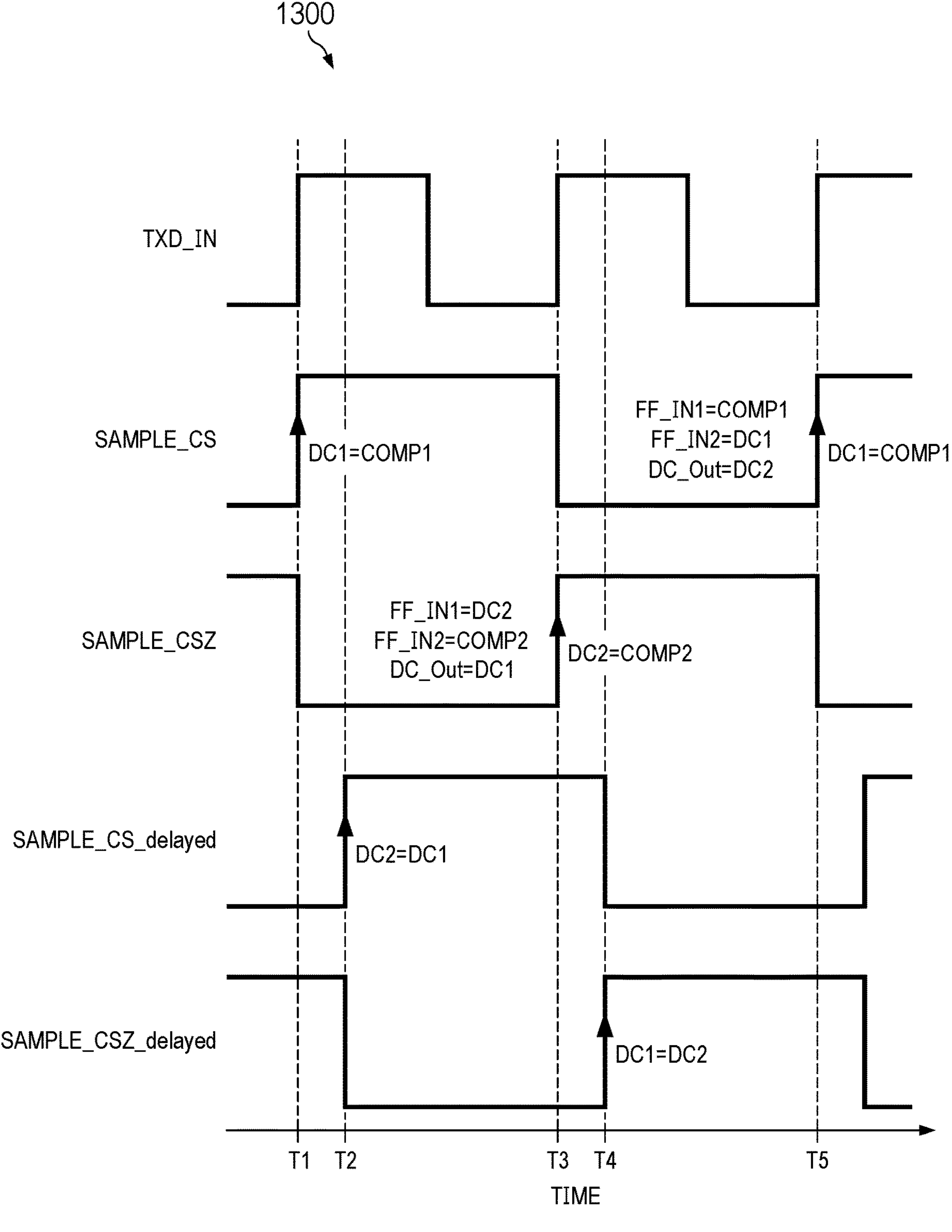
FIG. 13 is a timing diagram showing example duty-cycle detector signals for the analog duty-cycle detector circuit of FIG. 12.

FIG. 13 is a timing diagram 1300 showing example duty-cycle detector signals for the analog duty-cycle detector circuit 1200 of FIG. 12. In the timing diagram 1300, the example duty-cycle detector signals include TXD_IN, SAMPLE_CS, SAMPLE_CSZ, SAMPLE_CS_delayed, and SAMPLE_CSZ_delayed.

At time T1, SAMPLE_CS is asserted and DC1=COMP1. At time T2, SAMPLE_CS_delayed is asserted and DC2=DC1. From time T1 to time T3, FF_IN1=DC2, FF_IN2=COMP2, and DC_Out=DC1. At time T3, SAMPLE_CSZ is asserted and DC2=COMP2. At time T4, SAMPLE_CSZ_delayed is asserted and DC1=DC2. From time T3 to time T5, FF_IN1=COMP1, FF_IN2=DC1, and DC_Out=DC2. At time T5, DC1=COMP1. By using delayed sample signals (e.g., SAMPLE_CS_delayed and SAMPLE_CSZ_delayed) and equalizing DC2 and DC1 upon assertion of the delayed sample signals, the glitch issues described in FIGS. 9 and 10 are avoided.

In some examples, a circuit (e.g., the CAN transceiver 226 of FIG. 2; or the CAN transceiver 226A of FIG. 3) includes an analog duty-cycle detector circuit. Example analog duty-cycle detector circuits include one of the analog duty-cycle detector circuits 126A to 126N in FIG. 1, the analog duty-cycle detector circuit 244 in FIG. 2 or 3, the analog duty-cycle detector circuit 244A in FIG. 5, the analog duty-cycle detector circuit 244B in FIG. 6, the analog duty-cycle detector circuit 244C in FIG. 7, or one of the analog duty-cycle detector circuits 244D or 244E in FIG. 8. The analog duty-cycle detector circuit includes: off-time detection circuitry (e.g., the off-time detection circuitry 510 in FIG. 5; or related components in FIGS. 6-8); on-time detection circuitry (e.g., the on-time detection circuitry 516 in FIG. 5; or related components in FIGS. 6-8); compare circuitry (e.g., the compare circuitry 522 in FIG. 5, or the comparator 522A in FIGS. 6 and 7); and a controller (e.g., the controller 540 in FIG. 5, the latch circuit 832 and the delay circuit 842 in FIGS. 8 and 12).

In some examples, the off-time detection circuit has a first terminal (e.g., the first terminal 511 in FIG. 5), a second terminal (e.g., the second terminal 512 in FIG. 5), a third terminal (e.g., the third terminal 513 in FIG. 5), and a fourth terminal (e.g., the fourth terminal 514 in FIG. 5). In some examples, the off-time detection circuitry includes a first transistor (e.g., the transistor P2 in FIG. 6, or the transistor P4 in FIG. 7) and a first capacitor (e.g., the capacitor C5 in FIG. 6, or the capacitor C7 in FIG. 7). The first transistor has a first terminal, a second terminal, and a control terminal. The first capacitor has a first terminal and a second terminal. The first terminal of the first transistor is coupled to the first terminal of the off-time detection circuitry. The second terminal of the first transistor is coupled to the first terminal of the first capacitor.

In some examples, the on-time detection circuitry has a first terminal (e.g., the first terminal 517 in FIG. 5), a second terminal (e.g., the second terminal 518 in FIG. 5), a third terminal (e.g., the third terminal 519 in FIG. 5), and a fourth terminal (e.g., the fourth terminal 520 in FIG. 5). In some examples, the on-time detection circuitry includes a second transistor (e.g., the transistor P3 in FIG. 6, or the transistor P5 in FIG. 7) and a second capacitor (e.g., the capacitor C6 in FIG. 6, or the capacitor C8 in FIG. 7). The second transistor has a first terminal, a second terminal, and a control terminal. The second capacitor has a first terminal and a second terminal. The first terminal of the second transistor is coupled to the first terminal of the on-time detection circuitry. The second terminal of the second transistor is coupled to the first terminal of the second capacitor.

In some examples, the compare circuitry has a first terminal (e.g., the first terminal 524 in FIGS. 5 to 7), a second terminal (e.g., the second terminal 526 in FIGS. 5 to 7), and a third terminal (e.g., the third terminal 528 in FIGS. 5 to 7). The first terminal of the compare circuitry is coupled to the third terminal of the off-time detection circuitry. The second terminal of the compare circuitry is coupled to the third terminal of the on-time detection circuitry.

In some examples, the controller has a reset control terminal (e.g., the third terminal 546 in FIG. 5). The reset control terminal is coupled to the fourth terminal of the off-time detection circuitry and to the fourth terminal of the on-time detection circuitry.

In some examples, the analog duty-cycle detector circuit includes a latch circuit (e.g., the latch circuit 530 in FIG. 5) having a first terminal (e.g., the first terminal 532 in FIG. 5), a second terminal (e.g., the second terminal 534 in FIG. 5), and a third terminal (e.g., the third terminal 536 in FIG. 5). In such examples, the controller has a sample control terminal (e.g., the fourth terminal 548 in FIG. 5). The first terminal of the latch circuit is coupled to the third terminal of the compare circuitry. The second terminal of the latch circuit is coupled to the sample control terminal.

In some examples, the analog duty-cycle detector circuit includes current source circuitry (e.g., the current source circuitry 502 in FIG. 5, the first current source 602 and/or the second current source 608 in FIG. 6, or the first current source 702 in FIG. 7). The current source circuitry has an output (e.g., the second terminal 506 or the third terminal 508 in FIG. 5, the second terminal 606 or the second terminal 612 in FIG. 6, or the second terminal 706 in FIG. 7) coupled to the first terminal of the off-time detection circuitry and to the first terminal of the on-time detection circuitry.

In some examples, the off-time detection circuitry includes a third transistor (e.g., the transistor N2 in FIG. 6, or the transistor N4 in FIG. 7) having a first terminal, a second terminal, and a control terminal. The first terminal of the third transistor is coupled to the first terminal of the first capacitor. The second terminal of the third transistor is coupled to a threshold voltage source (e.g., the second current source 708 and the transistor P6 in FIG. 7). The control terminal of the third transistor is coupled to the fourth terminal of the off-time detection circuitry. In some examples, the on-time detection circuitry including a fourth transistor (e.g., the transistor N3 in FIG. 6, or the transistor N5 in FIG. 7) having a first terminal, a second terminal, and a control terminal. The first terminal of the fourth transistor is coupled to the first terminal of the second capacitor. The second terminal of the fourth transistor is coupled to the threshold voltage source. The control terminal of the fourth transistor is coupled to the fourth terminal of the on-time detection circuitry.

In some examples, the controller (e.g., the controller 540 in FIG. 5 or another controller) is configured to: provide a first control signal (e.g., CTRL2_LOW in FIG. 7) to the control terminal of the first transistor (e.g., the transistor P4 in FIG. 7); provide a second control signal (e.g., CTRL2_HI in FIG. 7) to the control terminal of the second transistor (e.g., the transistor P5 in FIG. 7); provide a third control signal (e.g., CTRL1_LOW in FIG. 7) to the control terminal of the third transistor (e.g., the transistor N4 in FIG. 7); and provide a fourth control signal (e.g., CTRL1_HI in FIG. 7) to the control terminal of the fourth transistor (e.g., the transistor N5 in FIG. 7). The first and third control signals (e.g., CTRL2_LOW and CTRL1_LOW) may follow a first control sequence (e.g., a first "make before break" control sequence) having a first interval and a second interval responsive to a reset trigger for the off-time detection circuitry. In some examples, the first and third transistors (e.g., the transistor P4 and N4 in FIG. 7) are turned on together during the first interval of the first control sequence. During the second interval of the first control sequence, the first transistor (e.g., the transistor P4) is turned off and the third transistor (e.g., the transistor N4) is turned on.

In some examples, the second and fourth control signals (e.g., CTRL2_HI and CTRL1_HI) follow a second control sequence (e.g., a second "make before break" control sequence) having a first interval and a second interval responsive to a reset trigger for the on-time detection circuitry. The second and fourth transistors (e.g., the transistors P5 and N5 in FIG. 7) may be turned on together during the first interval of the second control sequence. During the second interval of the second control sequence, the second transistor (e.g., the transistor P5) is turned off and the fourth transistor (e.g., the transistor N5) is turned on.

In some examples, the controller (e.g., the controller 540 in FIG. 5 or another controller) is configured to: provide a first control signal (e.g., CTRL2_LOW in FIG. 7) to the control terminal of the first transistor (e.g., the transistor P4 in FIG. 7); and provide a second control signal (e.g., CTRL2_HI in FIG. 7) to the control terminal of the second transistor (e.g., the transistor P5 in FIG. 7). In some examples, the first and second control signals (e.g., CTRL2_LOW and CTRL2_HI) follow a third control sequence (e.g., a first "break before make" control sequence) having a first interval and a second interval responsive to a transition from off-time detection to on-time detection. The first and second transistors (e.g., the transistors P4 and P5) may be turned off during the first interval of the third control sequence. During the second interval of the third control sequence, the first transistor (e.g., the transistor P4) is turned off and the second transistor (e.g., the transistor P5) is turned on. In some examples, the first and second control signals (e.g., CTRL2_LOW and CTRL2_HI) follow a fourth control sequence (e.g., a second "break before make" control sequence) having a first interval and a second interval responsive to a transition from on-time detection to off-time detection. During the first interval of the fourth control sequence, the first and second transistors (e.g., the transistor P4 and P5) are turned off. During the second interval of the fourth control sequence, the first transistor (e.g., the transistor P4) is turned on and the second transistor (e.g., the transistor P5) is turned off.

In some examples, the analog duty-cycle detector circuit includes current source circuitry (e.g., the current source circuitry 502 in FIG. 5) having a first output (e.g., the second terminal 506 in FIG. 5) and a second output (e.g., the third terminal 508 in FIG. 5). The first output is coupled to the first terminal of the off-time detection circuitry. The second output is coupled to the first terminal of the on-time detection circuitry. In such examples, the off-time detection circuitry may include a third transistor (e.g., the transistor N2 in FIG. 6) having a first terminal, a second terminal, and a control terminal. The first terminal of the third transistor is coupled to the first terminal of the first capacitor. The second terminal of the third transistor is coupled to a ground terminal. The control terminal of the third transistor is coupled to the fourth terminal of the off-time detection circuitry. In such examples, the on-time detection circuitry may include a fourth transistor (e.g., the transistor N3 in FIG. 6) having a first terminal, a second terminal, and a control terminal. The first terminal of the fourth transistor is coupled to the first terminal of the second capacitor. The second terminal of the fourth transistor is coupled to the ground terminal. The control terminal of the fourth transistor is coupled to the fourth terminal of the on-time detection circuitry.

In some examples, the controller is a first controller, the off-time detection circuitry is first off-time detection circuitry, the on-time detection circuitry is first on-time detection circuitry, the compare circuitry is first compare circuitry, and the analog duty-cycle detector circuit includes a first duty-cycle detector circuit (e.g., the first duty-cycle detector circuit 244D in FIG. 8) and a second duty-cycle detector circuit (e.g., the second duty-cycle detector circuit 244E in FIG. 8). In such examples, the first duty-cycle detector circuit includes the first off-time detection circuitry, the first on-time detection circuitry, and the first compare circuitry. The second duty-cycle detector circuit includes a second controller, second off-time detection circuitry, second on-time detection circuitry, and second compare circuitry. In such examples, the analog duty-cycle detector circuit includes combine circuitry (e.g., the multiplexer 822 in FIG. 8, or the multiplexers 1212, 1232 1252 in FIG. 12) to provide combined duty-cycle detection results (e.g., to combine DC1 and DC2) responsive to first duty-cycle detection results (e.g., DC1) obtained by the first duty-cycle detector circuit and second duty-cycle detection results (e.g., DC2) obtained by the second duty-cycle detector circuit. In some examples, the combine circuitry is configured to equate the first and second duty-cycle detection results responsive to a delayed sample control signal to avoid glitches in the combined duty-cycle detection results. For example, in some scenarios, DC2 is made equal to DC1 responsive to SAMPLE_CS_delayed being asserted as in FIGS. 12 and 13. In other scenarios, DC1 is made equal to DC2 responsive to SAMPLE_CSZ_delayed being asserted as in FIGS. 12 and 13). In some examples, the combine circuitry operates to: receive first duty-cycle detection results (e.g., DC1 herein); receive second duty-cycle detection results (e.g., DC2 herein); update the first duty-cycle detection results to equal to the second duty-cycle detection results responsive to a first delayed sample control signal (e.g., SAMPLE_CSZ_delayed herein); update the second duty-cycle detection results to equal to the first duty-cycle detection results responsive to a second delayed sample control signal (e.g., (e.g., SAMPLE_CS_delayed herein); and provide combined duty-cycle detection results (e.g., DC-Out herein) responsive to the duty-cycle detection results, the second duty-cycle detection results, the updated first duty-cycle detection results, and the updated second duty-cycle detection results.

In some examples, a circuit includes a first duty-cycle detect cell (e.g., the first duty-cycle detect cell 802 in FIGS. 8 and 12); a first latch circuit (e.g., the first latch circuit 806 in FIG. 8, or the latch circuit 1222 in FIG. 12); a second duty-cycle detect cell (e.g., the second duty-cycle detect cell 812 in FIGS. 8 and 12); and a second latch circuit (e.g., the second latch circuit 816 in FIG. 8, or the latch circuit 1242 in FIG. 12). In such examples, the first duty-cycle detect cell has a first terminal (e.g., the first terminal 803 in FIG. 8) and a second terminal (e.g., the second terminal 804 in FIG. 8). The first latch circuit has a first terminal (e.g., the first terminal 808 in FIG. 8, or the first terminal 1214 in FIG. 12), a second terminal (e.g., the second terminal 810 in FIG. 8, or the third terminal 1228 in FIG. 12), and a third terminal (e.g., the third terminal 811 in FIG. 8, or the fourth terminal 1230 in FIG. 12). The first terminal of the first latch circuit is coupled to the second terminal of the first duty-cycle detect cell. The second duty-cycle detect cell has a first terminal (e.g., the first terminal 813 in FIGS. 8 and 12) and a second terminal (e.g., the second terminal 814 in FIGS. 8 and 12). The second latch circuit has a first terminal (e.g., the first terminal 818 in FIG. 8, or the first terminal 1244 in FIG. 12), a second terminal (e.g., the second terminal 820 in FIG. 8, or the third terminal 1248 in FIG. 12), and a third terminal (e.g., the third terminal 821 in FIG. 8, or the fourth terminal 1250 in FIG. 12). The first terminal of the second latch circuit is coupled to the second terminal of the second duty-cycle detect cell.

In some examples, the circuit includes combine circuitry (e.g., the multiplexer 1212, 1232, and 1252 in FIG. 12) configured to provide combined duty-cycle detection results (e.g., to combine DC1 and DC2) responsive to first duty-cycle detection results (e.g., DC1) obtained by the first duty-cycle detect cell and the first latch circuit and second duty-cycle detection results (e.g., DC2) obtained by the second duty-cycle detect cell and the second latch circuit. In some examples, the combine circuitry includes a multiplexer (e.g., the multiplexer 822) having a first terminal (e.g., the first terminal 824 in FIG. 8), a second terminal (e.g., the second terminal 826 in FIG. 8), a third terminal (e.g., the third terminal 828 in FIG. 8), and a fourth terminal (e.g., the fourth terminal 830 in FIG. 8). The first terminal of the multiplexer coupled to the third terminal of the first latch circuit. The second terminal of the multiplexer coupled to the third terminal of the second latch circuit.

In some examples, the combine circuitry includes: a first multiplexer (e.g., the multiplexer 1212 in FIG. 12) between the first duty-cycle detect cell and the first latch circuit; and a second multiplexer (e.g., the multiplexer 1232 in FIG. 12) between the second duty-cycle detect cell and the second latch circuit. The first multiplexer is configured to forward comparison results (e.g., COMP1 in FIG. 12) from the first duty-cycle detect cell or the second duty-cycle detection results (e.g., DC2 in FIG. 12). The second multiplexer is configured to forward comparison results (e.g., COMP2 in FIG. 12) from the second duty-cycle detect cell or the first duty-cycle detection results (e.g., DC1 in FIG. 12). In such examples, the first latch circuit includes a fourth terminal (e.g., the second terminal 1226 in FIG. 12), and the second latch circuit includes a fourth terminal (e.g., the second terminal 1246 in FIG. 12). The first latch circuit is configured to latch an input (e.g., FF_IN1 in FIG. 12) at its first terminal to its third terminal responsive to a first sample control signal (e.g., SAMPLE_CS in FIG. 12) at its second terminal and a first delayed sample control signal (e.g., SAMPLE_CSZ_delayed in FIG. 12) at its fourth terminal. The second latch circuit is configured to latch an input (e.g., FF_IN2 in FIG. 12) at its first terminal to its third terminal responsive to a second sample control signal (e.g., SAMPLE_CSZ in FIG. 12) at its second terminal and a second delayed sample control signal (e.g., SAMPLE_CS_delayed in FIG. 12) at its fourth terminal.

In some examples, a transceiver (e.g., the CAN transceiver 226A of FIG. 3) includes: a first terminal (e.g., the fifth terminal 236 in FIG. 3); a second terminal (e.g., the fourth terminal 234 in FIG. 3); a third terminal (e.g., the sixth terminal 238 in FIG. 3); a fourth terminal (e.g., the seventh terminal 240 in FIG. 3); transmitter circuitry (e.g., the first and second buffer circuits 302 and 308, the control circuitry 314, the first driver circuit 330, and the second driver circuit 342 in FIG. 3) coupled between the first terminal, the third terminal, and the fourth terminal. The transmitter circuitry includes an analog duty-cycle detector circuit (e.g., the analog duty-cycle detector circuit 244A in FIG. 3) with a comparator. The transceiver also includes receiver circuitry (e.g., the receiver circuitry 356 in FIG. 3) coupled between the second terminal, the third terminal, and the fourth terminal.

In some examples, the analog duty-cycle detector circuit includes capacitors (e.g., the capacitors C5 and C6 in FIG. 6, or the capacitors C7 and C8 in FIG. 7), off-time detection circuitry (e.g., the off-time detection circuitry 510 in FIG. 5, or related components in FIGS. 6 and 7), on-time detection circuitry (e.g., the on-time detection circuitry 516 in FIG. 5, or related components in FIGS. 6 and 7), and a shared current source (e.g., the current source circuitry 502, or the first current source 702 in FIG. 7). The analog duty-cycle detector circuit is configured to: provide current from the shared current source to a first of the off-time detection circuitry or the on-time detection circuitry; and after an interval, provide current from the shared current source to a second of the off-time detection circuitry or on-time detection circuitry.

In some examples, the analog duty-cycle detector circuit includes a first duty-cycle detect cell and a second duty-cycle detect cell (e.g., the duty-cycle detect cells 802 and 812 in FIG. 8) operated in tandem. In some examples, the analog duty-cycle detector circuit is configured to: obtain first duty-cycle detection results (e.g., DC1 herein) from the first duty-cycle detect cell; obtain second duty-cycle detection results (e.g., DC2 herein) from the second duty-cycle detect cell; update the first duty-cycle detection results to equal to the second duty-cycle detection results responsive to a first delayed sample control signal (e.g., SAMPLE_CSZ_delayed herein); update the second duty-cycle detection results to equal to the first duty-cycle detection results responsive to a second delayed sample control signal (e.g., SAMPLE_CS_delayed); and provide combined duty-cycle detection results (e.g., DC-Out) responsive to the duty-cycle detection results, the second duty-cycle detection results, the updated first duty-cycle detection results, and the updated second duty-cycle detection results.

obtain delayed sample control signals (e.g., SAMPLE_CS_delayed or SAMPLE_CSZ_delayed in FIGS. 12 and 13); and equalize results (e.g., DC1=DC2 responsive to assertion of SAMPLE_CS_delayed, or DC2=DC1 responsive to assertion of SAMPLE_CS_delayed as described in FIGS. 12 and 13) of the two duty-cycle detect cells responsive to the delayed sample control signals to avoid glitches. In some examples, operations of the transmitter circuitry and the receiver circuitry are based on a controller area network extra-long (CAN XL) protocol.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component and/or a conductor.

A circuit or device described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field-effect transistor ("FET") such as an NFET or a PFET, a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control terminal and its first and second terminals. In the context of a FET, the control terminal is the gate, and the first and second terminals are the drain and source. In the context of a BJT, the control terminal is the base, and the first and second terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. A circuit comprising:

an analog duty-cycle detector circuit including:

off-time detection circuitry having a first terminal, a second terminal, a third terminal, and a fourth terminal, the off-time detection circuitry including a first transistor and a first capacitor, the first transistor having a first terminal, a second terminal, and a control terminal, the first capacitor having a first terminal and a second terminal, the first terminal of the first transistor coupled to the first terminal of the off-time detection circuitry, the second terminal of the first transistor coupled to the first terminal of the first capacitor;

on-time detection circuitry having a first terminal, a second terminal, a third terminal, and a fourth terminal, the on-time detection circuitry including a second transistor and a second capacitor, the second transistor having a first terminal, a second terminal, and a control terminal, the second capacitor having a first terminal and a second terminal, the first terminal of the second transistor coupled to the first terminal of the on-time detection circuitry, the second terminal of the second transistor coupled to the first terminal of the second capacitor;

compare circuitry having a first terminal, a second terminal, and a third terminal, the first terminal of the compare circuitry coupled to the third terminal of the off-time detection circuitry, and the second terminal of the compare circuitry coupled to the third terminal of the on-time detection circuitry, the compare circuitry configured to compare a charge across the first capacitor and a charge across the second capacitor; and a controller having a reset control terminal, the reset control terminal coupled to the fourth terminal of the off-time detection circuitry and to the fourth terminal of the on-time detection circuitry.

2. The circuit of claim 1, wherein the analog duty-cycle detector circuit includes a latch circuit having a first terminal, a second terminal, and a third terminal, the controller has a sample control terminal, the first terminal of the latch circuit coupled to the third terminal of the compare circuitry, the second terminal of the latch circuit coupled to the sample control terminal.

3. The circuit of claim 1, wherein the analog duty-cycle detector circuit includes current source circuitry having an output coupled to the first terminal of the off-time detection circuitry and to the first terminal of the on-time detection circuitry, the off-time detection circuitry includes a third transistor having a first terminal, a second terminal, and a control terminal, the first terminal of the third transistor coupled to the first terminal of the first capacitor, the second terminal of the third transistor coupled to a threshold voltage source, the control terminal of the third transistor coupled to the fourth terminal of the off-time detection circuitry, the on-time detection circuitry including a fourth transistor having a first terminal, a second terminal, and a control terminal, the first terminal of the fourth transistor coupled to the first terminal of the second capacitor, the second terminal of the fourth transistor coupled to the threshold voltage source, and the control terminal of the fourth transistor coupled to the fourth terminal of the on-time detection circuitry.

4. The circuit of claim 3, wherein the controller is configured to:

provide a first control signal to the control terminal of the first transistor;

provide a second control signal to the control terminal of the second transistor;

provide a third control signal to the control terminal of the third transistor; and provide a fourth control signal to the control terminal of the fourth transistor, the first and third control signals following a first control sequence having a first interval and a second interval responsive to a reset trigger for the off-time detection circuitry, the first and third transistors turned on together during the first interval of the first control sequence, the first transistor turned off and the third transistor turned on during the second interval of the first control sequence, the second and fourth control signals following a second control sequence having a first interval and a second interval responsive to a reset trigger for the on-time detection circuitry, the second and fourth transistors turned on together during the first interval of the second control sequence, the second transistor turned off and the fourth transistor turned on during the second interval of the second control sequence.

5. The circuit of claim 3, wherein the controller is configured to:

provide a first control signal to the control terminal of the first transistor; and provide a second control signal to the control terminal of the second transistor, the first and second control signals following a first control sequence having a first interval and a second interval responsive to a transition from off-time detection to on-time detection, the first and second transistors turned off during the first interval of the first control sequence, the first transistor turned off and the second transistor turned on during the second interval of the first control sequence, the first and second control signals following a second control sequence having a first interval and a second interval responsive to a transition from on-time detection to off-time detection, the first and second transistors turned off during the first interval of the second control sequence, the first transistor turned on and the second transistor turned off during the second interval of the second control sequence.

6. The circuit of claim 1, wherein the analog duty-cycle detector circuit includes current source circuitry having a first output and a second output, the first output coupled to the first terminal of the off-time detection circuitry, and the second output coupled to the first terminal of the on-time detection circuitry, the off-time detection circuitry includes a third transistor having a first terminal, a second terminal, and a control terminal, the first terminal of the third transistor coupled to the first terminal of the first capacitor, the second terminal of the third transistor coupled to a ground terminal, the control terminal of the third transistor coupled to the fourth terminal of the off-time detection circuitry, the on-time detection circuitry includes a fourth transistor having a first terminal, a second terminal, and a control terminal, the first terminal of the fourth transistor coupled to the first terminal of the second capacitor, the second terminal of the fourth transistor coupled to the ground terminal, and the control terminal of the fourth transistor coupled to the fourth terminal of the on-time detection circuitry.

7. The circuit of claim 1, wherein the controller is a first controller, the off-time detection circuitry is first off-time detection circuitry, the on-time detection circuitry is first on-time detection circuitry, the compare circuitry is first compare circuitry, the analog duty-cycle detector circuit includes a first duty-cycle detector circuit and a second duty-cycle detector circuit, the first duty-cycle detector circuit including the first off-time detection circuitry, the first on-time detection circuitry, and the first compare circuitry, the second duty-cycle detector circuit including a second controller, second off-time detection circuitry, second on-time detection circuitry, and second compare circuitry, the analog duty-cycle detector circuit including combine circuitry to provide combined duty-cycle detection results responsive to first duty-cycle detection results obtained by the first duty-cycle detector circuit and second duty-cycle detection results obtained by the second duty-cycle detector circuit.

8. The circuit of claim 7, wherein the combine circuitry is configured to:

receive first duty-cycle detection results;

receive second duty-cycle detection results;

update the first duty-cycle detection results to equal to the second duty-cycle detection results responsive to a first delayed sample control signal;

update the second duty-cycle detection results to equal to the first duty-cycle detection results responsive to a second delayed sample control signal; and provide the combined duty-cycle detection results responsive to the duty-cycle detection results, the second duty-cycle detection results, the updated first duty-cycle detection results, and the updated second duty-cycle detection results.

* * * * *